United States Patent [19]

Kawai

[11] Patent Number: 5,140,399
[45] Date of Patent: Aug. 18, 1992

[54] HETEROJUNCTION BIPOLAR TRANSISTOR AND THE MANUFACTURING METHOD THEREOF

[75] Inventor: Hiroji Kawai, Kanagawa, Japan

[73] Assignee: Sony Corporation, Tokyo, Japan

[21] Appl. No.: 675,018

[22] Filed: Mar. 25, 1991

Related U.S. Application Data

[63] Continuation of Ser. No. 465,631, Jan. 9, 1990, abandoned, which is a continuation of Ser. No. 187,361, Apr. 28, 1988, abandoned.

[30] Foreign Application Priority Data

Apr. 30, 1987 [JP] Japan .................. 62-107352

[51] Int. Cl.$^5$ .................. H01L 29/205; H01L 29/72
[52] U.S. Cl. .................. 357/34; 357/16; 357/47; 357/58; 365/155
[58] Field of Search .................. 357/47, 58, 16, 34; 365/155

[56] References Cited

U.S. PATENT DOCUMENTS

| | | | |
|---|---|---|---|
| 4,314,359 | 2/1982 | Kato et al. | 365/155 |
| 4,428,111 | 1/1984 | Swartz | 357/34 |
| 4,775,882 | 10/1988 | Miller et al. | 357/34 |
| 4,779,127 | 10/1988 | Honjo | 357/58 |

FOREIGN PATENT DOCUMENTS

| | | | |
|---|---|---|---|
| 0039015 | 2/1982 | European Pat. Off. | 357/34 |
| 0206787 | 12/1986 | European Pat. Off. | 357/34 |
| 1464286 | 4/1969 | Fed. Rep. of Germany | 357/34 |
| 1017777 | 1/1966 | United Kingdom | 357/34 |

OTHER PUBLICATIONS

IEEE Transactions On Electron Devices, vol. ED-32, No. 11, Nov. 1985, pp. 2345-2377.

*Primary Examiner*—Jerome Jackson, Jr.
*Attorney, Agent, or Firm*—Hill, Van Santen, Steadman & Simpson

[57] ABSTRACT

A heterojunction bipolar transistor formed as a collector top or emitter top type. This heterojunction bipolar transistor can operate at high speed and can be fabricated into a semiconductor integrated circuit with ease. The manufacturing method thereof is also disclosed.

6 Claims, 19 Drawing Sheets

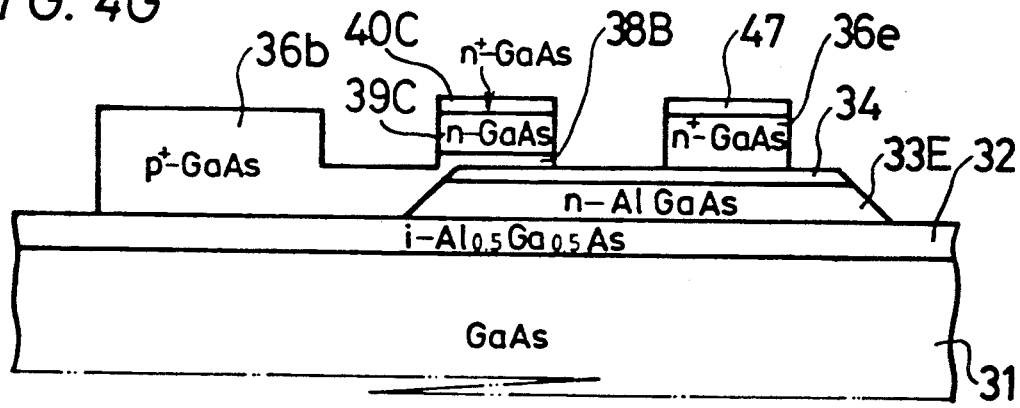
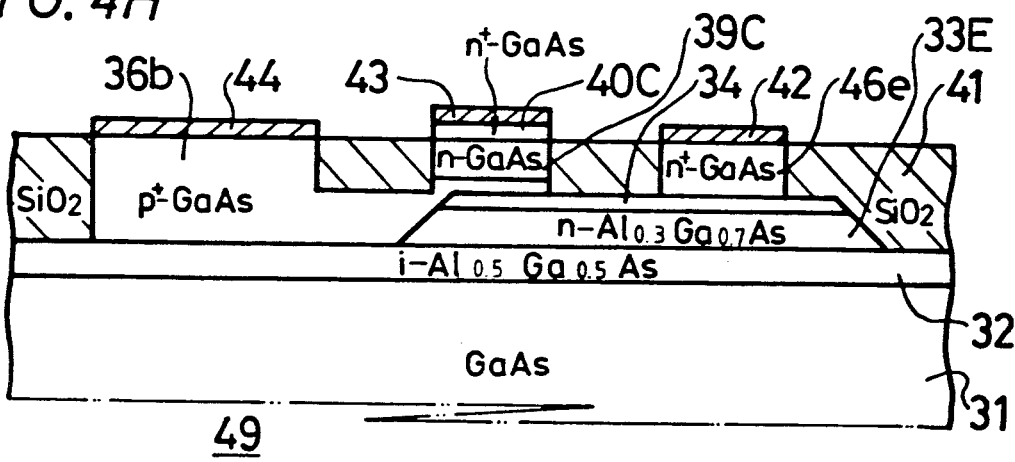
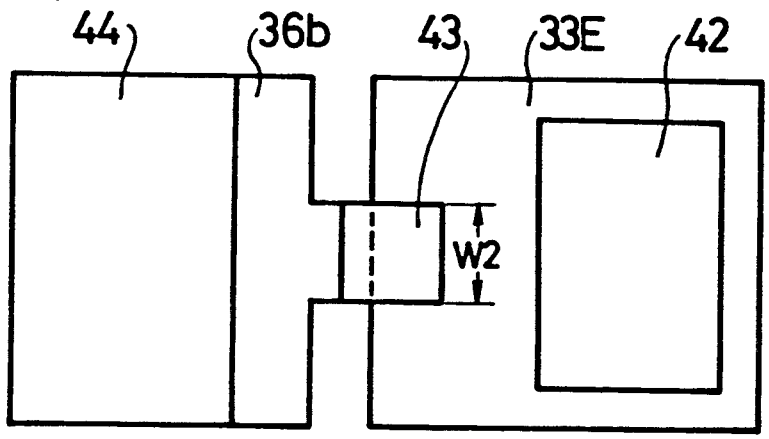

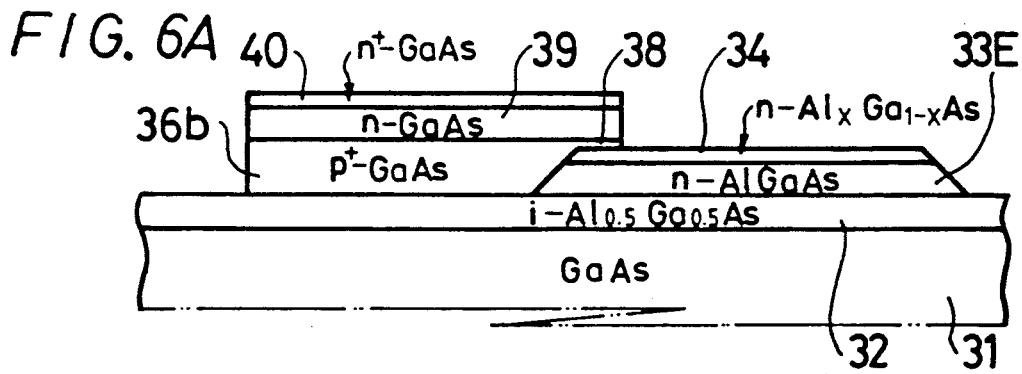
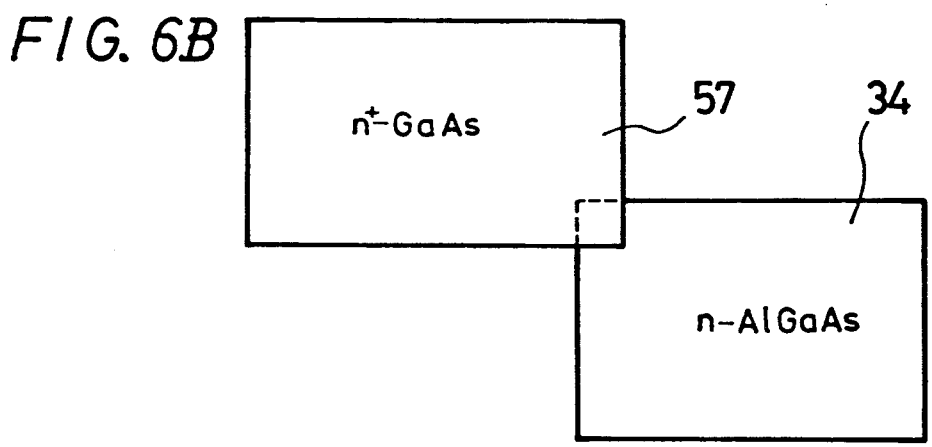
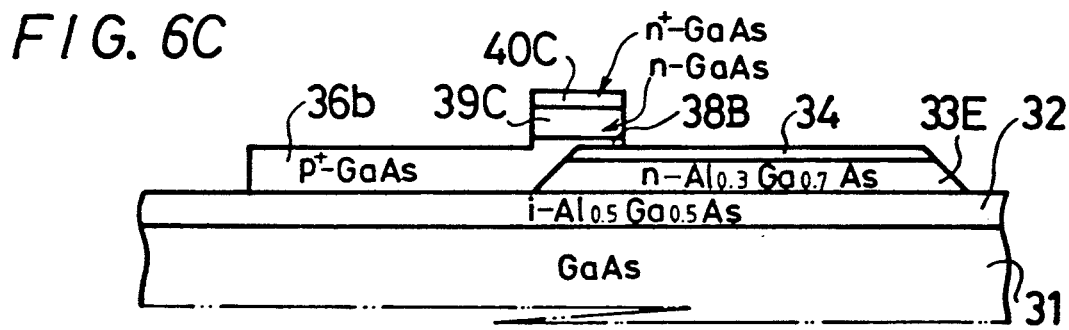
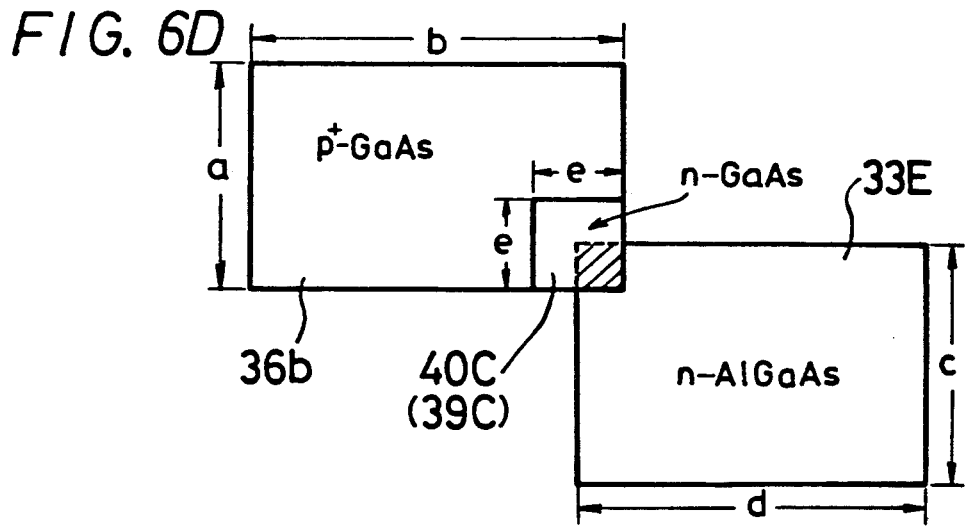

HETEROJUNCTION BIPOLAR TRANSISTOR AND THE MANUFACTURING METHOD THEREOF

This is a continuation, of application Ser. No. 465,631, filed Jan. 9, 1980 now abandoned, which is a continuation of Ser. No. 187,361 filed Apr. 28, 1988, now abandoned.

BACKGROUND OF THE INVENTION

1. Field of the Invention

The present invention relates to a heterojunction bipolar transistor and the manufacturing method thereof. More particularly, this invention relates to a semiconductor integrated circuit in which the above heterojunction bipolar transistor is used.

2. Description of the Prior Art

Generally, a known heterojunction bipolar transistor can overcome the shortcomings encountered with a homojunction bipolar transistor formed of silicon. By way of example, the description is presented on a heterojunction bipolar transistor having an AlGaAs emitter, a GaAs base and a GaAs collector. According to this heterojunction bipolar transistor, the hole as the majority carrier in the base cannot be diffused into the emitter due to the energy barrier caused by a band gap difference ($\Delta Eg$) between the emitter and the base. As a result, the base current is decreased and the efficiency of the electron injection from the emitter to the base is increased. Thus, even if the base concentration is increased and the emitter concentration is decreased, it is possible to increase the current gain ($\beta = I_c/I_B$). This means that a base resistance and the junction capacitance between the base and the emitter relating to the high operation speed can be reduced. Experimentally, it was proved that this heterojunction bipolar transistor can be operated at speed higher than that of the bipolar transistor formed of silicon.

FIG. 1 shows an example of a typical AlGaAs/GaAs planar heterojunction bipolar transistor made by employing the ion implantation technique and the metal burying technique. An example of a method of manufacturing this AlGaAs/GaAs planar heterojunction bipolar transistor with this structure will be described briefly as follows.

In FIG. 1, reference numeral 13 generally designates the AlGaAs/GaAs planar heterojunction bipolar transistor. On a semi-insulating GaAs substrate 1, there are epitaxially grown an n+-GaAs layer which will become a collector electrode deriving layer 2, an n-GaAs layer which will become a collector region 3, a p-GaAs layer which will become a base region (intrinsic base region) 4, an n-AlGaAs layer which will become an emitter region 5 and an n−-GaAs layer and n+-GaAs layer which will become a capping layer 6 in this order. Then, the n+-GaAs capping layer 6 is etched away so as to leave the emitter region, and the ion implanation for Mg is carried out by using an SiO₂ mask and an external base region 7 is formed by the annealing process. Then, the ion implantation for boron B or H+ is carried out to form an element separating region 8 and a base/collector separating region 9. Thereafter, a window is formed through an SiO₂ layer 10 on the collector electrode forming region to form a trench (groove) 11 and a metal 12 is buried into the trench 11, thus the transistor 13 being formed. In FIG. 1, reference numeral 14 denotes a base electrode, 15 an emitter electrode and 16 a collector electrode, respectively.

Meanwhile, there is proposed a so-called collector top heterojunction bipolar transistor 17 in which its collector region is formed at its surface side as shown in FIG. 2. The process for manufacturing this collector top heterojunction bipolar transistor is substantially the same as that for the emitter top heterojunction bipolar transistor 13, except the sequential order of the epitaxial growth. In FIG. 2, like parts corresponding to those of FIG. 1 are marked with the same references. In FIG. 2, reference numeral 18 denotes an n+-GaAs layer which will become an emitter electrode deriving layer, 5 an n-AlGaAs layer which will become an emitter region, 4 a p-GaAs layer which will become a base region, 3 an n-GaAs layer which will become a collector region, 19 an n+-GaAs layer which will become a collector cap layer and 7 an external base region.

A switching time $\tau s$ of the heterojunction bipolar transistor is given by the following equation $$\tau s = \frac{5}{2} Rb\, Cc + \frac{Rb}{R_L} \tau b + (3Cc + C_L) \cdot R_L,$$

where Rb represents the base resistance, Cc the capacitance between the base and the collector, $R_L$ the load resistance, $C_L$ the load capacitance and $\tau b$ the base transit time. Therefore, to reduce the switching time $\tau s$, the base resistance Rb and the capacitance Cc between the base and the collector must be reduced. In general, since collector top heterojunction bipolar transistor is more advantageous in reducing the capacitance Cc than the emitter top heterojunection bipolar transistor, the former is considered to be capable of operating at speed higher than the latter. The reason for this is as follows. (i) Since the collector top heterojunction bipolar transistor is small in collector dimension, the collector to base junction capacitance is reduced. This advantage permits high speed operation of the bipolar transistor. Conversely, the emitter dimension thereof is increased so that the emitter to base capacitance is increased. Although this is not a merit of the collector top heterojunction bipolar transistor, since the contact between the emitter and the base is the heterojunction, the capacitance therebetween becomes smaller than that of the homojunction. Further, since the emitter concentration is small, the emitter junction capacitance can be reduced originally, causing no trouble. The collector top heterojunction bipolar transistor has much more advantages by reducing the collector capacitance and it can operate at higher operation speed according to the demonstrated simulation results. (ii) In regard to the circuitry, in the case of the ECL (emitter-coupled-logic), the emitters of some transistors are commonly coupled to form a gate so that the dimension of element can be reduced by making the n+ emitter layers common without isolation.

In the above-mentioned conventional heterojunction bipolar transistors, if the dimension of the device is made smaller, the capacitance at the periphery of the active region, that is, the capacitances at the peripheries between the collector and the external base and between the emitter and the external base are relatively increased. For example, in the collector top heterojunction bipolar transistor shown in FIG. 2, calculating the capacitance where the collector dimension is $1 \times 1\ \mu m^2$, the intrinsic capacitance is small such that the emitter to base capacitance is $Ceb \simeq 2.7$ fF and that the collector to base capacitance $Cbc \simeq 0.27$ fF (4000 Å assumes the thickness of the depletion layer). However, the extrinsic capacitance, that is, the capacitances $Ceb'$ and $Cbc'$ produced only at the peripheries are very large as expressed in $Ceb' \simeq 3.2$ fF and $Cbc' \simeq 0.5$ fF. Thus, it is desired that the heterojunction bipolar transistor is constructed so as to suppress the capacitance at the peripheral portion as the dimension of the device is reduced. In practice, silicon bipolar transistors are constructed in this way.

In the heterojunction bipolar transistor shown, for example, in FIG. 2, if the external capacitance is reduced, the base contact region is reduced so that the base contact resistance is increased, thus restricting the operation speed of the element.

In addition to the above mentioned defects, the conventional heterojunction bipolar transistor with the external base formed by the ion implantation has the following defects.

(a) The concentration of the external base region cannot be increased.

(b) By the diffusion of the injected impurity into the emitter region and the diffusion of the impurity in the intrinsic base region, upon annealing for activation, the junction position is displaced.

(c) As the dimension of device is reduced, the external capacitances at peripheries produced between the emitter and the external base and between the collector and the external base are relatively increased. Particularly, the collector capacitance at the periphery cannot be removed.

(d) To derive the collector (or emitter) electrode, the techniques for forming a deep trench and burying a metal must be adopted.

(e) The contact dimension between the base and the emitter cannot be increased without increasing the capacitance.

(f) Of the electrons injected from the emitter region to the intrinsic base region, the electron at the periphery is diffused into the external base region by the diffusing length (several micrometers) and recombined with the hole to become a base current, thus causing a so-called periphery effect. Thus, when the element is reduced in size, the current gain is lowered.

(g) There is a limit in reducing the intrinsic region.

OBJECTS AND SUMMARY OF THE INVENTION

It is a general object of the present invention to provide an improved heterojunction bipolar transistor and the manufacturing method thereof.

It is an object of the present invention to provide a heterojunction bipolar transistor with a small collector capacitance and a small emitter capacitance and also with a small base contact resistance and which can operate at higher speed and which can be formed into an integrated circuit (IC) with ease and the manufacturing method thereof.

It is still another object of the present invention to provide a heterojunction bipolar transistor which can operate at higher operation speed and can be formed into the integrated circuit with ease and which can prevent a leak current from being produced and the manufacturing method thereof.

It is a further object of the present invention to provide a heterojunction bipolar transistor which can reduce its intrinsic region and can be fabricated as an integrated circuit and which can operate at higher operation speed and the manufacturing method thereof.

It is yet a further object of the present invention to provide collector top and emitter top heterojunction bipolar transistors with a small collector capacitance and a small emitter capacitance and which can be operated at higher speed and fabricated as an integrated circuit and a semiconductor integrated circuit which can be fabricated as an integrated circuit including a load resistor.

According to an aspect of the present invention, there is provided a heterojunction bipolar transistor comprising:

a) an external base region;

b) an emitter region;

c) a collector region, said external base region contacting with said emitter or collector region at their side surfaces; and d) an intrinsic base region formed on a region including a boundary between said emitter or collector region and said external base region, wherein said collector or emitter region is formed on said intrinsic base region.

According to other aspect of the present invention, there is provided a method of manufacturing a heterojunction bipolar transistor comprising the steps of:

a) forming on a substrate an emitter or collector region and an external base region in such a manner that they contact with each other at their side surfaces; and b) sequentially growning an intrinsic base region and said collector or emitter region on a region including a boundary between said emitter or collector region and said external base region by an epitaxial process.

According to further aspect of the present invention, there is provided a heterojunction bipolar transistor comprising:

a) an emitter region;

b) a base region; and c) a collector region, wherein an intrinsic base region and an external base region of said base region contact with each other at one side and the width of said intrinsic base region is selected smaller than that of said external base region.

According to further aspect of the present invention, there is provided a heterojunction bipolar transistor comprising:

a) a compound semiconductor substrate;

b) an emitter region;

c) a base region;

d) a collector region, wherein an external base region of said base region and said emitter region contact with each other at their side surfaces; and e) a barrier layer formed between said external base and emitter regions and said compound semiconductor substrate.

According to further aspect of the present invention, there is provided a heterojunction bipolar transistor comprising:

a) an emitter region;

b) a collector region;

c) a base region, said base region being partly overlapped on said emitter or collector region, wherein said collector or emitter region is formed on a region including said overlapped portion of said base region; and d) an intrinsic region formed of said overlapped portion.

According to still a further aspect of the present invention, there is provided a semiconductor integrated circuit having a collector top type heterojunction bipolar transistor, said heterojunction bipolar transistor comprising:

A) a collector top type heterojunction bipolar transistor having
a) an emitter region;
b) an external base region which contacts with said emitter region at their one side surfaces;
c) an intrinsic base region formed on a region including a boundary between said emitter region and said external base region; and
d) a collector region formed on said intrinsic base region; and B) a load resistor made of a material layer the same as that forming said emitter or base region, of said collector top type heterojunction bipolar transistor.

According to yet a further aspect of the present invention, there is provided a semiconductor integrated circuit having an emitter top type heterojunction bipolar transistor, said heterojunction bipolar transistor comprising:

A) an emitter top type heterojunction bipolar transistor having
a) a collector region;
b) an external base region which contacts with said collector region at their one side surfaces;
c) an intrinsic base region formed on a region including a boundary between said collector region and said external base region; and
d) an emitter region formed on said intrinsic base region; and B) a load resistor made of a material the same as that of said collector or base region of said emitter top type heterojunction bipolar transistor.

These and other objects, features and advantages of the present invention will become apparent from the following detailed description of the illustrative embodiments of the invention to be taken in conjunction with the accompanying drawings, throughout which like references identify the same or similar parts.

BRIEF DESCRIPTION OF THE DRAWINGS

FIGS. 4A to 4H are respectively cross-sectional views of other embodiment of the collector top type heterojunction bipolar transistor according to the present invention in accordance with the sequential orders of its manufacturing processes;

FIG. 4I is a plan view of FIG. 4H;

FIGS. 6A, 6C and 6E are respectively cross-sectional views of further embodiment of the collector top type heterojunction bipolar transistor according to the present invention in accordance with the sequential orders of its manufacturing processes;

FIGS. 6B, 6D and 6F are respectively plan views of FIGS. 6A, 6C and 6E;

DETAILED DESCRIPTION OF THE PREFERRED EMBODIMENTS

Now, an embodiment of a collector-top type heterojunction bipolar transistor according to the present invention and the manufacturing method thereof will hereinafter be described with reference to FIG. 3.

Figure 1:
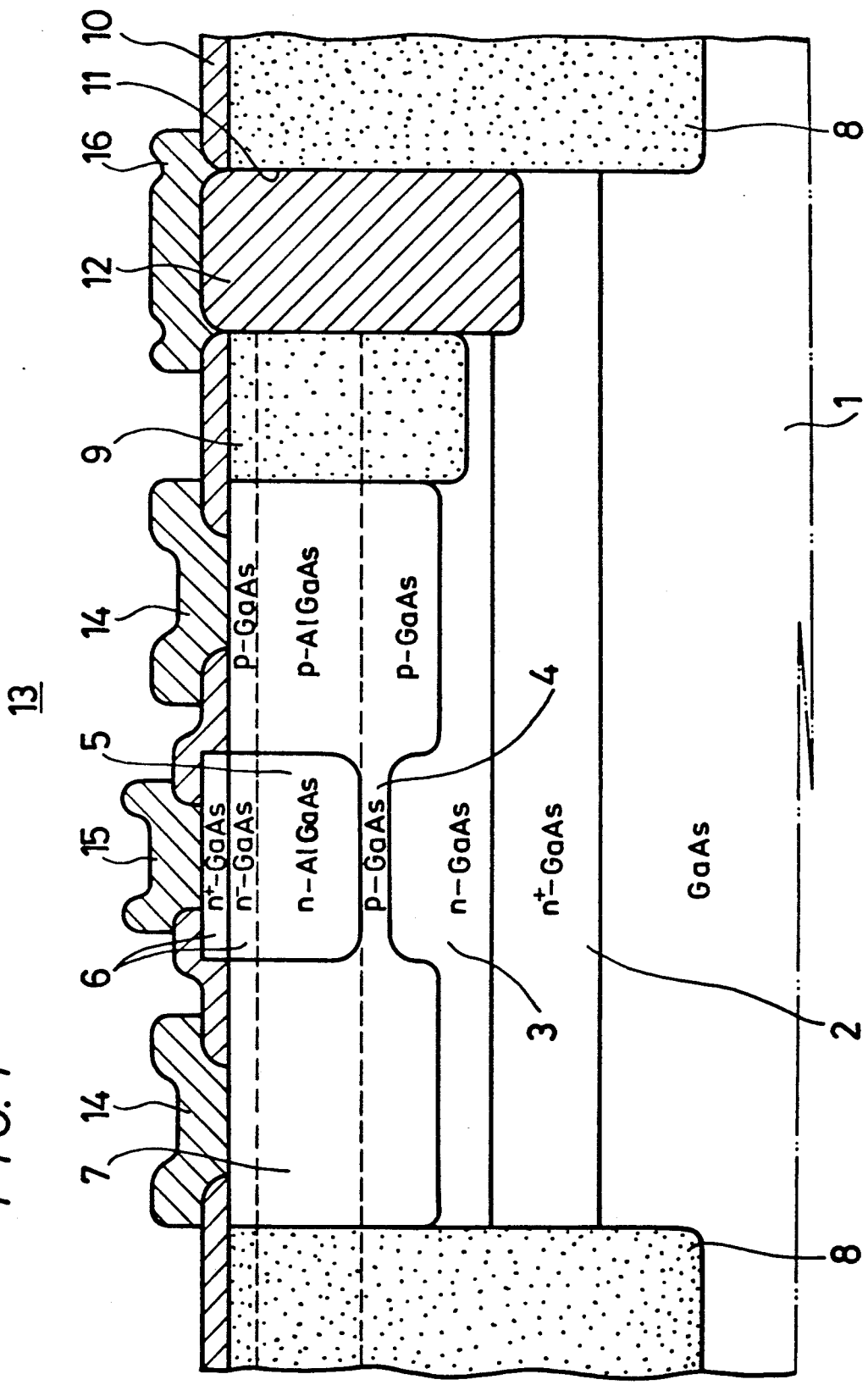
FIG. 1 is a cross-sectional view of a conventional emitter top type heterojunction bipolar transistor.
Figure 2:
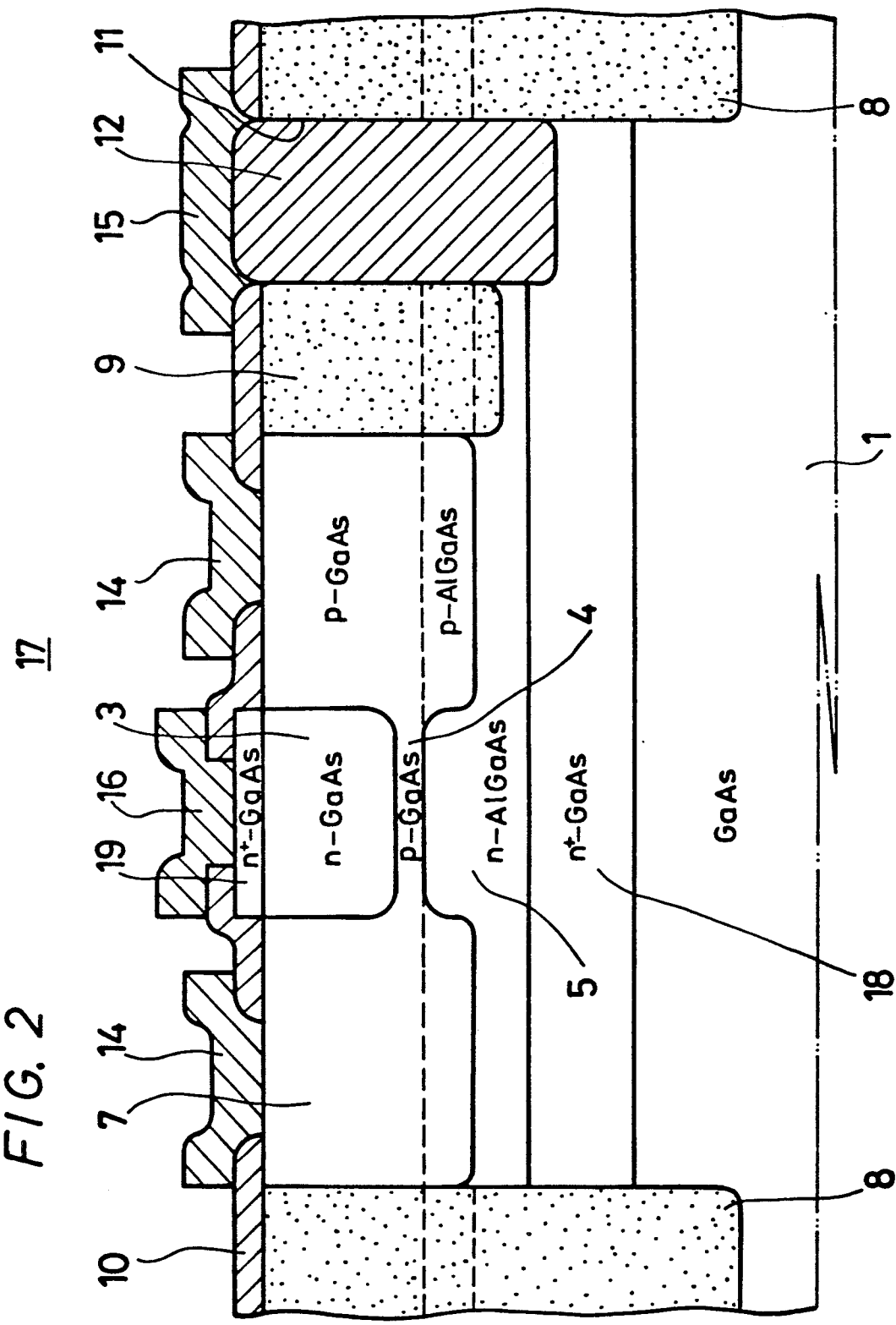
FIG. 2 is a cross-sectional view of a conventional collector top type heterojunction bipolar transistor.
Figure 3A:
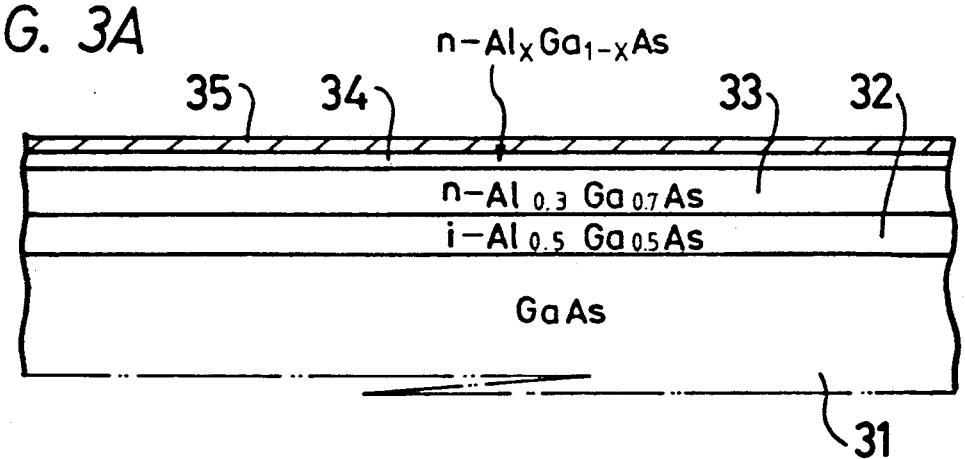
FIGS. 3A to 3F are respectively cross-sectional views illustrating an embodiment of a collector top type heterojunction bipolar transistor according to the present invention in accordance with the sequential orders of its manufacturing processes.

As shown in FIG. 3A, on a semi-insulating GaAs substrate 31, there are sequentially grown according to the MOCVD (metalorganic chemical vapor deposition) method, a wide band gap layer having high resistance which will become a barrier layer 32 for an emitter, that is, a semi-insulating 0.3 $\mu$m-thick i-Al$_{0.5}$Ga$_{0.5}$(undoped) layer, an Si-doped 0.5 $\mu$m-thick n-Al$_{0.3}$Ga$_{0.7}$As layer 33 having impurity concentration of about $2 \times 10^{18}$ cm$^{-3}$ which will become an emitter region, and an graded composition layer 34 formed by sequentially changing the Al composition ratio x in n-Al$_x$Ga1-$_x$As from 0.3 to 0. The graded composition layer 34 is 0.03 $\mu$m-thick and has the impurity concentration of about $5 \times 10^{17}$ cm$^{-3}$. This composition layer 34 is formed in such a manner that the ratio x is gradually changed from 0.3 to 0 as viewed from its bottom to its top. On the inclined composition layer 34, there is deposited a 0.1 $\mu$m-thick silicon nitride (Si$_3$N$_4$) layer 35.

Figure 3B:
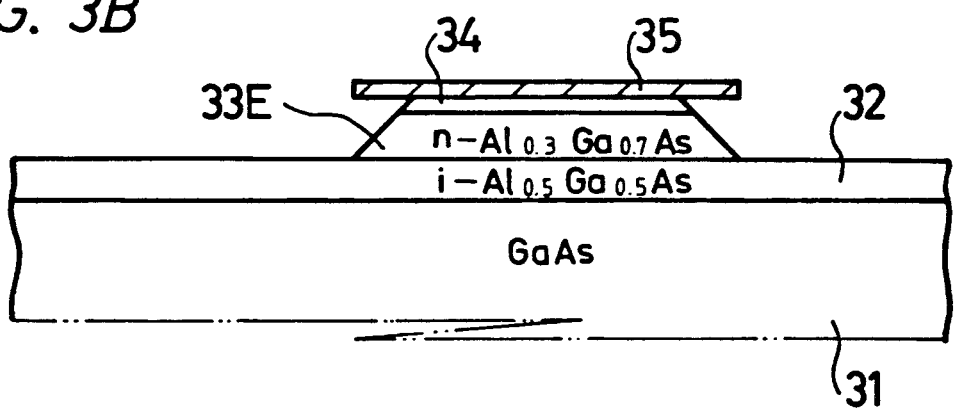

Then, as shown in FIG. 3B, the silicon nitride layer 35 is etched away so as to leave the portion corresponding to the emitter region. Thereafter, the remaining silicon nitride layer 35 is used as a mask layer to carry out the wet etching by which the graded composition layer 34 and the n-Al$_{0.3}$Ga$_{0.7}$As layer 33 are selectively etched away to form an emitter region 33E.

Figure 3C:
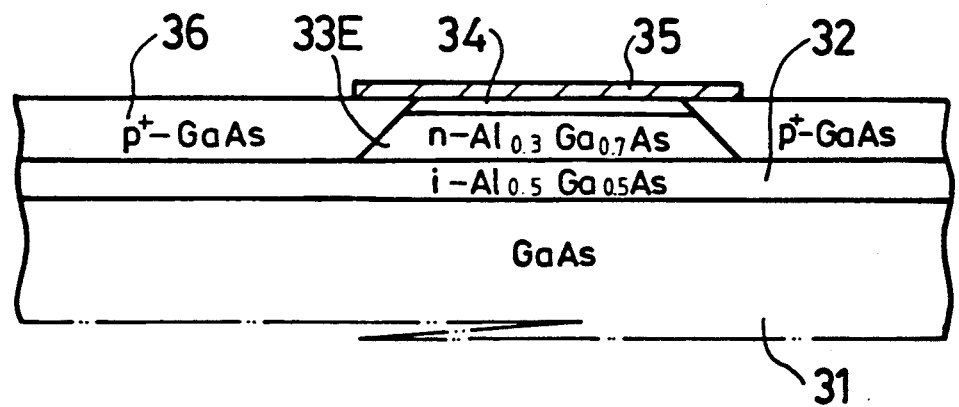

As shown in FIG. 3C, with the employment of the remaining silicon nitride layer 35 as a mask layer, a p$^+$-GaAs layer 36 which will become an external base region is selectively grown to the height the same as that of the under surface of the silicon nitride layer 35.

Figure 3D:
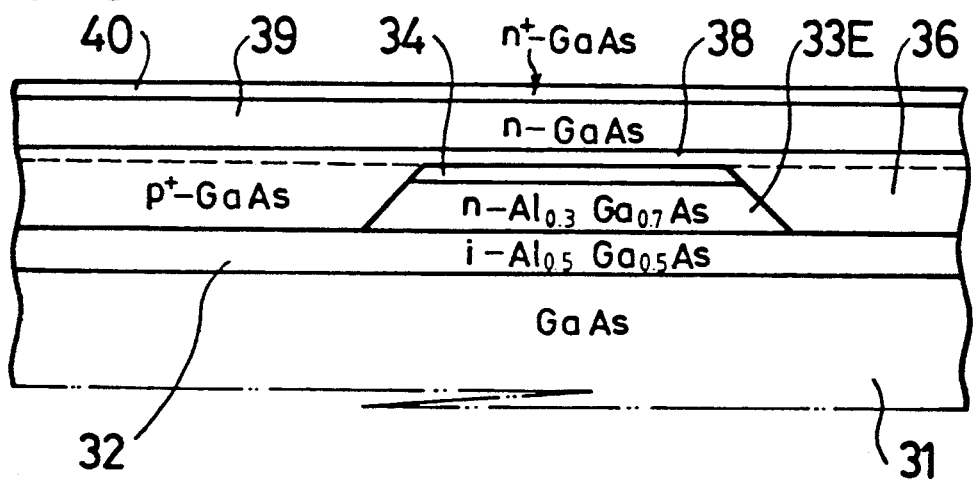

Then, as shown in FIG. 3D, after the silicon nitride layer 35 is removed, an undoped GaAs 0.01 $\mu$m-thick spacer layer (not shown), a 0.1 $\mu$m-thick p$^+$-GaAs layer 38 having the impurity concentration of about $2 \times 10^{19}$ cm$^{-3}$ which will become an intrinsic base region, a 0.4 μm-thick n-GaAs layer 39 having the impurity concentration of about $10^{17}$ cm$^{-3}$ which will become a collector region and a 0.1 μm-thick n+-GaAs layer 40 having impurity concentration of about $5 \times 10^{18}$ cm$^{-3}$ which will become a collector cap layer are sequentially grown by the MOCVD method. The undoped GaAs spacer layer is effective for preventing the p-type impurity (for example, Zn) of the p+-GaAs layer 38 from being diffused into the n-AlGaAs emitter region 33E.

Figure 3E:
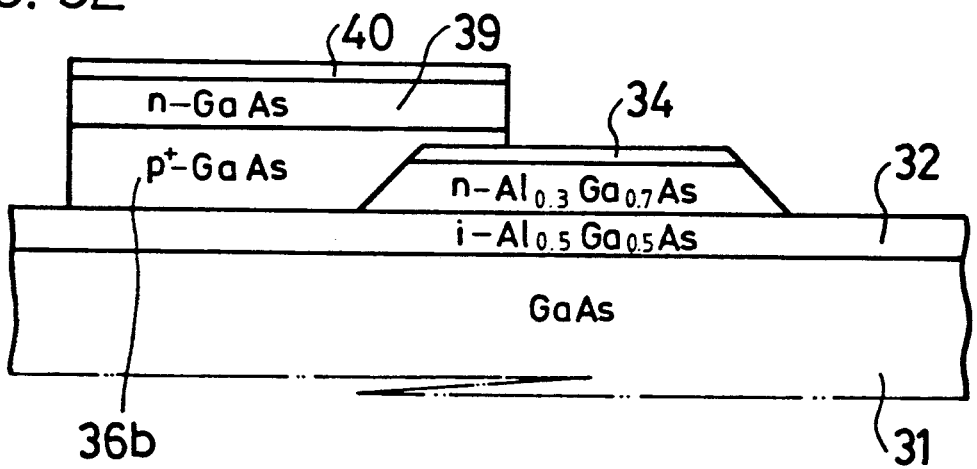

As shown in FIG. 3E, leaving the portions corresponding to the collector region and the external base region, the n+-GaAs layer 40, the n-GaAs layer 39 and the p+-GaAs layers 38 and 36 are selectively etched away according to the RIE (reactive ion etching) process. Thus, the external base region 36b is formed. Since the AlGaAs layer is not etched away by the RIE process, the exposure of the surface of the graded composition layer 34 forming a part of the emitter region and the isolation among the elements are carried out by the RIE process.

Figure 3F:
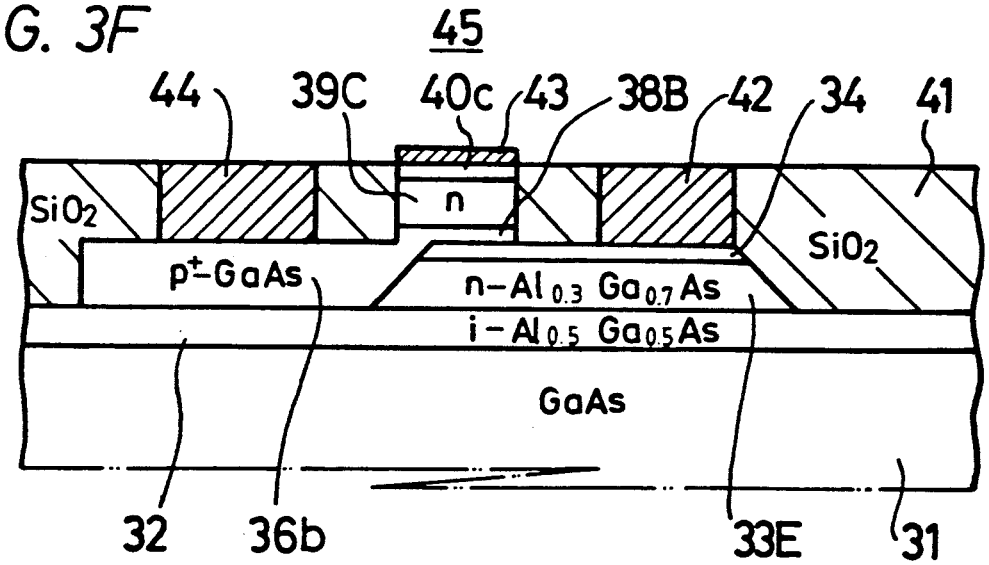
Figure 3G:
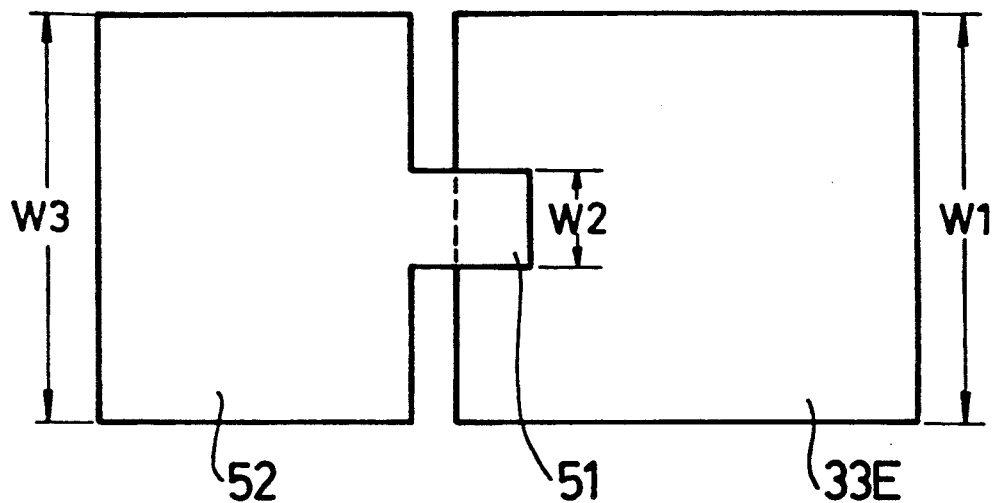
FIGS. 3G and 3H are respectively plan views of FIGS. 3E and 3F.

In this case, the selective etching pattern is made to be shown in FIG. 3G as viewed from the plane. Specifically, the selective etching process is carried out such that the pattern includes, as shown in FIG. 3G, a region 51 (corresponding to the dimension of the intrinsic portion which will be described later) overlapping, on the central portion of one edge of the square-shaped emitter region 33E by a width W2 smaller than a width W1 of the emitter region 33E, and a region 52 (corresponding to the dimension of the external base region which will be described later) coupled to the extended portion of this region 51 extended outside the emitter region 33E with a width W3 (W1=W3 in the illustrated example) larger than the width W2 of the region 51.

Figure 3H:
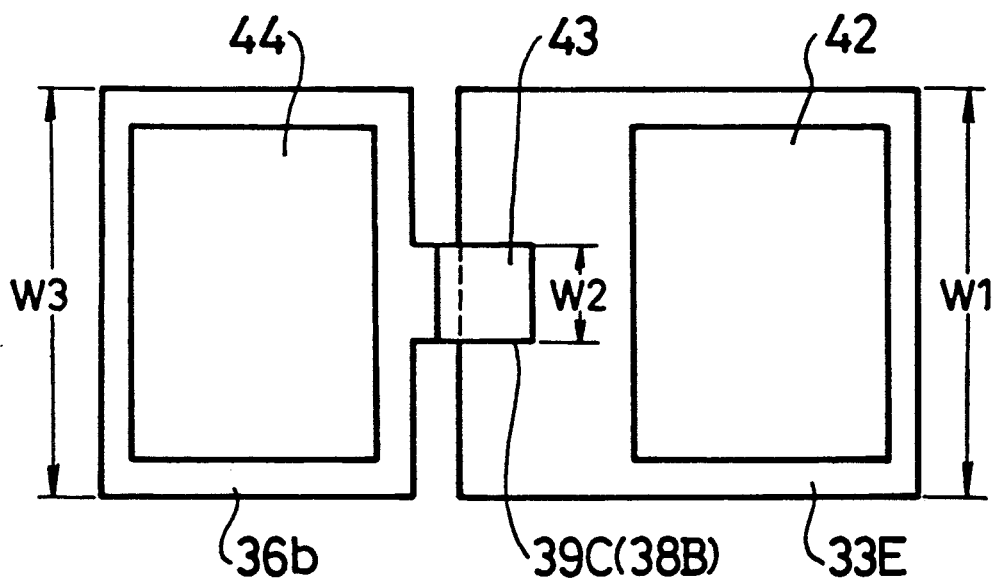

Then, the n+-GaAs layer 40, n-GaAs layer 39 and the p+-GaAs layer 38 on the external base region 36b are selectively removed by the RIE process to form the collector cap layer 40c, the collector region 39c and the intrinsic base region 38B. Then, the silicon oxide (SiO$_2$) layer 41 is formed on the whole surface, made flat and then opposed to the surface in the collector cap layer 40c. Thereafter, the windows for deriving the base electrode and the emitter electrode are formed through the silicon oxide layer 41, for the n-AlGaAs emitter region, i.e., the graded composition layer 34 on the surface thereof and for the n+-GaAs capping layer 40c, there are formed an AuGe/Au emitter electrode 42 and a collector electrode 43. Also, a Ti/Pt/Au base electrode 44 is formed on the p+-GaAs external base region 36b. Thus, as shown in FIGS. 3F and 3H, the external base region 36b and the emitter region 33E are formed in contact with each other at one side surfaces thereof and under the external base region 36b and the emitter region 33E, there is formed a semi-insulating AlGaAs barrier layer 32. On one portion of the emitter region 33E, there are formed the intrinsic base region 38B and the collector region 39C having the width W2 smaller than the width W3 of the external base region 36B and the width W1 of the emitter region 33E so as to include the boundary between the emitter region 33E and the external base region 36b, that is, so as to come in contact with the external base region 36b in part. Therefore, the external base region 36b and the intrinsic base region 38B are brought in contact with each other at one edge, thus producing the collector-top type heterojunction bipolar transistor 45 in which the width W2 of the intrinsic base region 38B is selected to be smaller than the width W3 of the external base region 36b.

FIG. 4 illustrates other embodiment of the collector top type heterojunction bipolar transistor to which the present invention is applied.

Figure 4A:
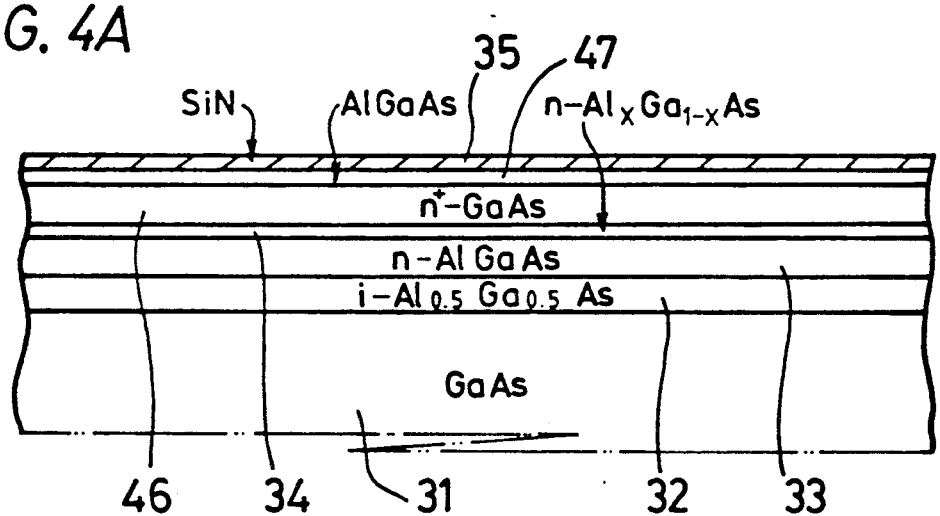

According to this embodiment, as shown in FIG. 4A, on the semi-insulating GaAs substrate 31, there are sequentially deposited by the MOCVD process a semi-insulating 0.3 μm-thick Al$_{0.5}$Ga$_{0.5}$As (undoped) layer which will become a barrier layer 2 relative to the emitter, an Si-doped 0.5 μm-thick n-Al$_{0.3}$Ga$_{0.7}$As layer 33 having the impurity concentration of about $2 \times 10^{18}$ cm$^{-3}$ which will become an emitter region, a 0.03 μm-thick inclined composition layer 34 having the impurity concentration of about $5 \times 10^{17}$ cm$^{-3}$ formed by sequentially changing the composition ratio x of the n-Al$_x$Ga$_{1-x}$As layer, a 0.5 μm-thick n+-GaAs layer 46 having impurity concentration of about $5 \times 10^{18}$ cm$^{-3}$ which will become an emitter cap layer and a 0.02 μm-thick n-Al$_{0.3}$Ga$_{0.7}$As layer 47 having the impurity concentration of about $5 \times 10^{18}$ cm$^{-3}$. On the n-Al$_{0.3}$Ga$_{0.7}$As layer 47, there is formed a 0.1 m-thick silicon nitride (SiN) layer 35.

Figure 4B:
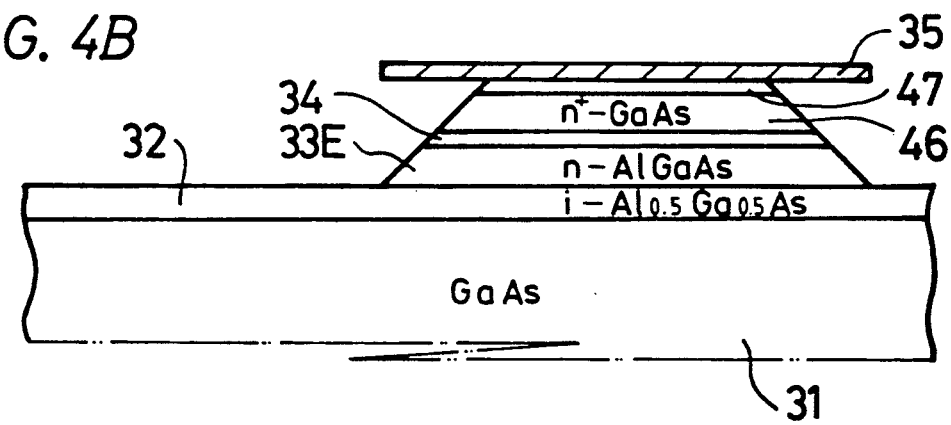

Then, as shown in FIG. 4B, the silicon nitride layer 35 is selectively etched away to leave its portion corresponding to the emitter region. Then, this left silicon nitride layer 35 is employed as a mask layer to selectively etch and remove the n-Al$_{0.3}$Ga$_{0.7}$As layer 47, the n+-GaAs layer 46, the graded composition layer 34 and the n-Al$_{0.3}$Ga$_{0.7}$ layer 33 to form an emitter region 33E.

Figure 4C:
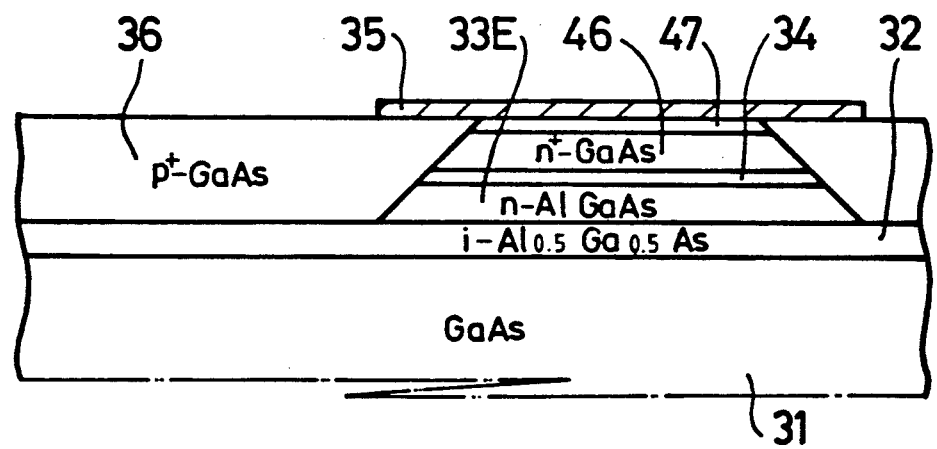

As shown in FIG. 4C, with the employment of the silicon nitride layer 35 as a mask, the p+-GaAs layer 36 which will become the external base region is selectively grown to the height up to the under surface of the silicon nitride layer 35.

Figure 4D:
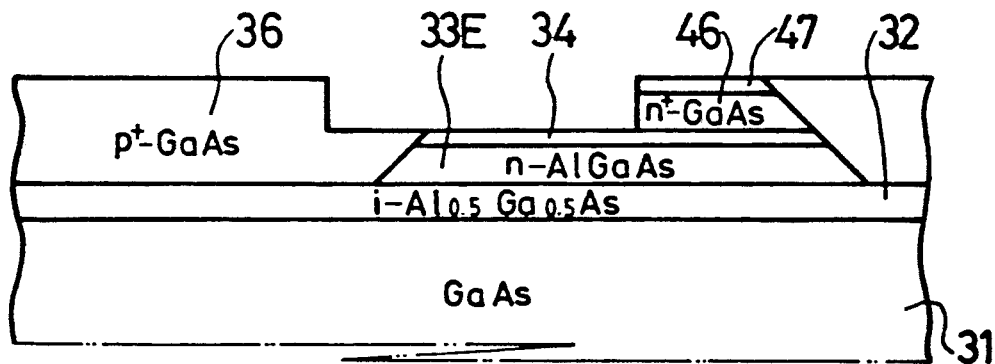

As shown in FIG. 4D, after the silicon nitride layer 35 is removed, a portion of the n-Al$_{0.3}$Ga$_{0.7}$As layer 47 containing the portion corresponding to the collector region is removed by the wet etching process. Subsequently, according to the RIE process, portions of the n+-GaAs layer 46 and the p+-GaAs layer 36 including the boundary between and p+-GaAs layer 36 and the n+-GaAs layer 46 are selectively etched and removed by the amount corresponding to the thickness of the n+-GaAs layer 46.

Figure 4E:
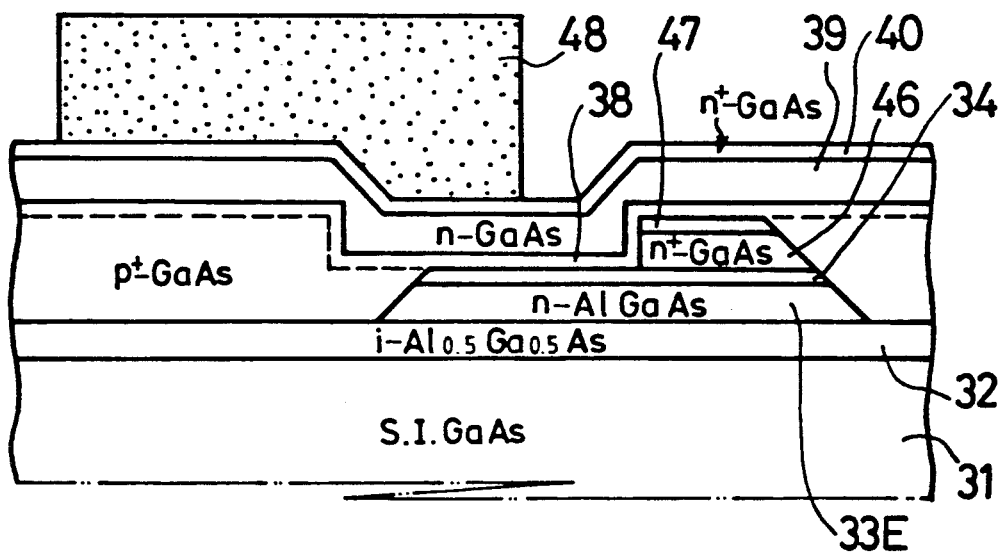

Then, as shown in FIG. 4E, there are sequentially grown a 0.01 μm-thick undoped GaAs spacer layer (not shown), a 0.1 μm-thick p+-GaAs layer 38 having the impurity concentration of about $2 \times 10^{19}$ cm$^{-3}$ which will become an intrinsic base region, a 0.4 μm-thick n+-GaAs layer 39 having the impurity concentration of about $10^{17}$ cm$^{-3}$ which will become a collector region and a 0.1 μm-thick n+-GaAs layer 40 having the impurity concentration of about $5 \times 10^{18}$ cm$^{-3}$ which will become a collector capping layer by the MOCVD method.

Figure 4F:
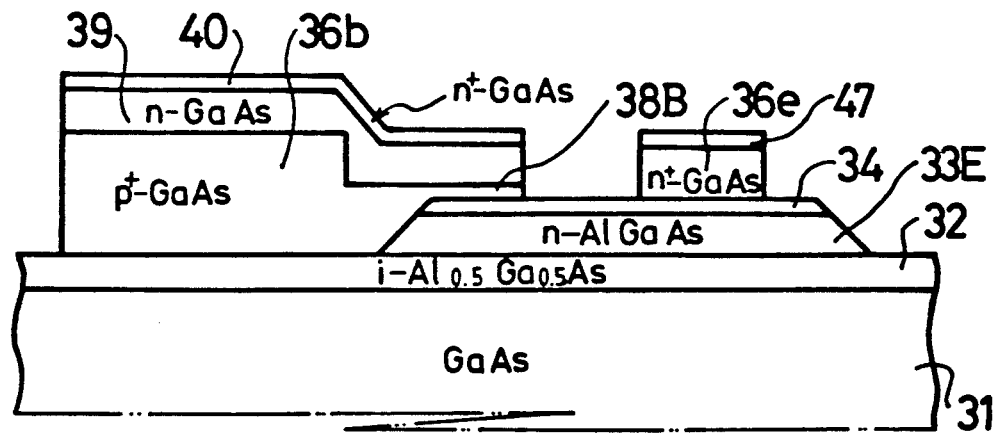

As shown in FIG. 4F, with the employment of a mask 48 (refer to FIG. 4E), the n+-GaAs layer 40, the n-GaAs layer 39 and the p+-GaAs layer 36 are selectively etched away by the RIE process to leave the portions corresponding to the collector region and the external base region. Thus, the external base region 36b and the emitter capping layer 46e are formed. At that time, the AlGaAs layer is not etched by the RIE process. Therefore, since the AlGaAs layer 47 is formed on the emitter capping layer 46e, the emitter capping layer 46e is not etched away.

As shown in FIG. 4G, the n+-GaAs layer 40 and the n-GaAs layer 39 on the external base region 36b are selectively etched away. Thus, the collector capping layer 40c, the collector region 39C and the intrinsic base region 38B are formed, respectively.

Next, with the employment of the CVD process, as shown in FIG. 4H, the silicon oxide (SiO₂) layer 41 is deposited on the whole surface and then made flat, whereby there are exposed the surfaces of the external base region 36b, the collector capping layer 40c and the emitter capping layer 46e. Thereafter, on the collector capping layer 40c and the emitter capping layer 46e, there are respectively formed an AuGe/Au collector electrode 43 and an AuGe/Au emitter electrode 42. Further, on the external base region 33b, there is formed a Ti/Pt/Au base electrode 44 to thereby form a desired collector top type heterojunction bipolar transistor 49 as shown in FIG. 4H. FIG. 4I is a plan view of this heterojunction bipolar transistor 49.

The thus formed collector top type heterojunction bipolar transistor has the following advantages.

Since the collector region 39C is formed as mesa-type and the side surface thereof is covered with the silicon oxide layer 41, the collector capacitance at the periphery is not produced and there exists only the intrinsic collector capacitance as the collector capacitance. Thus, the collector capacitance becomes extremely small.

Since the external base region 36b is formed of the epitaxial layer having a thickness of 0.5 $\mu$m and which has the impurity concentration of more than $2 \times 10^{19}$ cm$^{-3}$, the impurity concentration thereof can be improved by about one order as compared with the case that the external base region is formed by the ion implantation on a prior art n-AlGaAs layer and also, the mobility thereof can be increased. Thus, the external base resistance thereof can be decreased. In order to reduce the base contact resistance, it is sufficient to increase the contact dimension in addition to the increase of the impurity concentration at the external base region 36b. According to the heterojunction bipolar transistor with the conventional structure, however, this increase of the impurity concentration causes the collector capacitance to be increased. Meanwhile, according to the structure of the present invention, since the external base region 36b does not substantially contact with the collector region 39C and contacts with the emitter region 33E at its only one side surface having the width W2, the dimension of the external base region 36b can be increased without increasing the external capacitance, thus the base contact resistance being decreased.

As shown in FIGS. 3G and 4I, the emitter region 33E and the external base region 36b contact with each other in a range of the width W2 at one side surface so that the emitter capacitance can be decreased.

According to the above embodiments of the present invention, however, as the dimension of the device is reduced, the capacitances produced between the emitter and the external base and between the collector and the external base are prevented from being increased relatively. In addition, the base contact resistance thereof can be decreased, so that the above heterojunction type bipolar transistors can be operated at high speed and can be fabricated into an IC with ease.

Since the heterojunction bipolar transistor of the invention is formed such that the emitter region 33E and the external base region 36b contact with each other only at the one edge, the electron injected from the emitter region 33E to the intrinsic base region 38B can be less diffused into the external base region 36b. This means that the loss of the electron at the periphery can be decreased (that is, the so-called periphery effect can be decreased in principle). Thus, even when the dimension of the active region is reduced as small as $1 \times 1$ $\mu$m², the high current gain can be achieved in the low current region.

Since the semi-insulating AlGaAs barrier layer 32 having the wide gap is formed between the semi-insulating GaAs substrate 31 and both of the emitter region 33E and the external base region 36b, it is possible to prevent a current from being leaked through the substrate 31 between the p+-GaAs external base region 36b and the n-AlGaAs emitter region 33E.

Further, since the n-Al$_x$Ga$_{1-x}$As graded composition layer 34 is provided between the emitter region 33E and the intrinsic base region 38B, the mobility of electron can be improved and therefore, a so-called emitter current can be flowed with ease.

According to the structure of the present invention, since the base, collector and emitter are substantially formed as a planar structure (structure in which the electrodes are provided on the upper surface), the trench used in the prior art for deriving the emitter electrode or the collector elecrode becomes unnecessary. Also, the elements can be automatically isolated as the collector region is formed by the RIE process. In addition, the ion implantation technique and the annealing technique are not required so that the reproducibility of the elements can be enhanced.

Further, according to the present invention, after the thick external base region 36b has been formed, the intrinsic base region 38B is formed by the final epitaxial growth. Therefore, the thickness of the intrinsic base region 38B can be reduced as much as possible, and for example, the intrinsic base region 38B can be formed to have a thickness ranging from 200 to 300 Å with excellent accuracy. At the same time, there is formed no displacement in junction. Further, the load resistor can easily be realized by the n-AlGaAs layer 33 forming the emitter region 33E or the p+-GaAs layer 36 forming the external base region 36b.

The CML (common mode logic) is generally known as the high speed bipolar circuit. In the collector top type heterojunction bipolar transistor structure of the present invention, the emitter can be made common to the transistors, thus making it possible to fabricate the CML structure with ease. For example, in case of two gates of 3-input NOR and OR circuits, though not shown, the load resistors can be integrally formed as a unitary structure in the AlGaAs layer which forms, for example, the emitter region. According to this structure, as compared with the conventional emitter top type heterojunction bipolar transistor, the long lead wire is not laid around so that the structure thereof can be simplified.

FIG. 5 illustrates an embodiment of the present invention which is applied to the emitter top type heterojunction bipolar transistor.

Figure 5A:
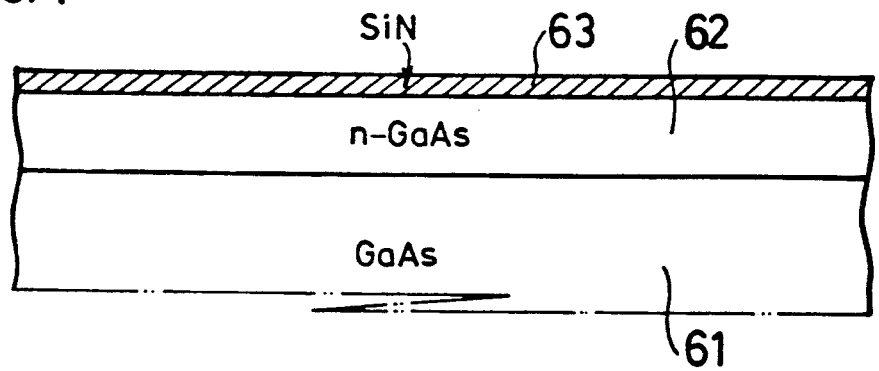
FIGS. 5A to 5G are respectively cross-sectional views illustrating other embodiment of an emitter top type heterojunction bipolar transistor according to the present invention in accordance with the sequential orders of its manufacturing processes.

In accordance with this embodiment, as shown in FIG. 5A, on a semi-insulating GaAs substrate 61, there is grown a 0.6 $\mu$m-thick n-GaAs layer 62 having the impurity concentration in the order of about $10^{17}$ cm$^{-3}$ which will become a collector region by the MOCVD method. Further, on this n-GaAs layer 62, there is deposited a 0.1 μm-thick silicon nitride layer 63 by the CVD (chemical vapor deposition) method.

Figure 5B:
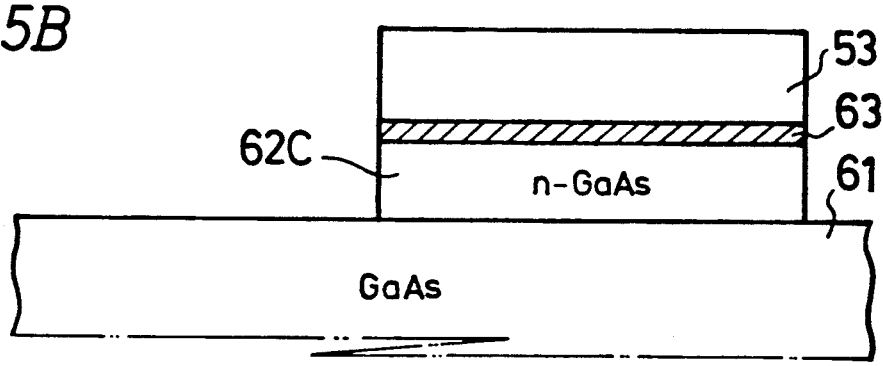

Then, as shown in FIG. 5B, with a photoresist layer 53 employed as a mask, other silicon nitride layer 63 and the n-GaAs layer 62 beneath the former are selectively etched away by the RIE process while leaving their portions corresponding to the collector region, thus forming a collector region 62C.

Figure 5C:
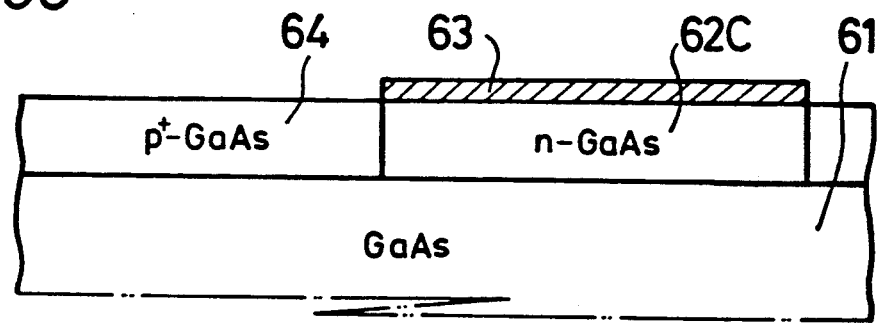

Next as shown in FIG. 5C, while the remaining-silicon nitride layer 63 is used as a mask, a 0.6 μm-thick p+-GaAs layer 64 having the impurity concentration of about $2 \times 10^{19}$ cm$^{-3}$ which will become an external base region is selectively grown with the thickness substantially same as that of the collector region 62C.

Figure 5D:
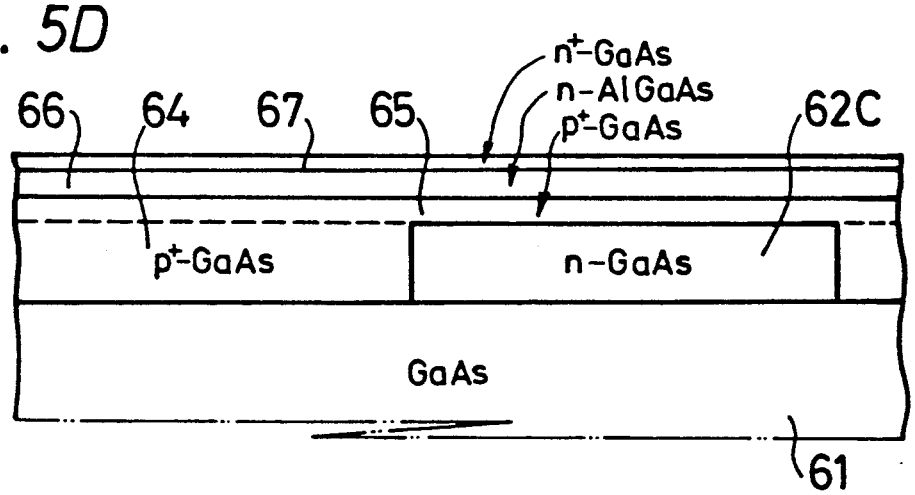

Then, as shown in FIG. 5D, the silicon nitride layer 63 is removed by the HF solution. Thereafter, on the collector region 62C and the p+-GaAs layer 64, there are sequentially grown a 0.05 μm-thick p+-GaAs layer 65 having the impurity concentration of about $2 \times 10^{19}$ cm$^{-3}$ which will become an intrinsic base region, a 0.15 μm-thick undoped GaAs spacer layer (not shown), a 0.15 μm-thick n-Al$_{0.3}$Ga$_{0.7}$As layer 66 having the impurity concentration of about $5 \times 10^{17}$ cm$^{-3}$ which will become an emitter region and a 0.05 μm-thick n+-GaAs layer 67 having the impurity concentration of about $5 \times 10^{18}$ cm$^{-3}$ which will become a capping layer for the emitter.

Figure 5E:
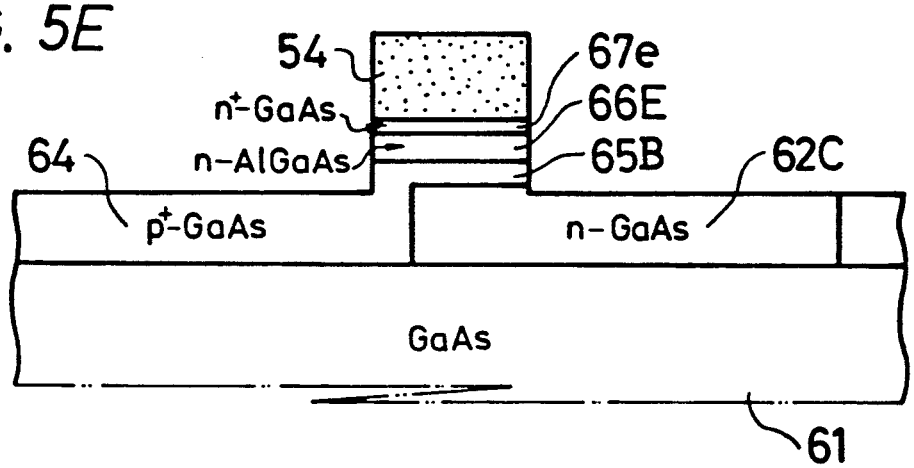

Then, as shown in FIG. 5E, the portion corresponding to the emitter region is masked by a photoresist layer 54 and the etching by the RIBE (reactive ion beam etching) process is carried out to the depth of 0.4 μm. In other words, the n+-GaAs layer 67, the n-AlGaAs layer 66, the p+-GaAs layer 65 and a p+-GaAs layer 64 which will become the external base region are selectively etched so as to reach a part of the collector region 62C, whereby the surface of the p+-GaAs layer 64 and the surface of the collector region 62C are exposed to the outside. Thus, an emitter capping layer 67e, an emitter region 66E and an intrinsic base region 65B are respectively formed. If there is no RIBE apparatus, the above process can be made by the wet etching process.

Figure 5F:
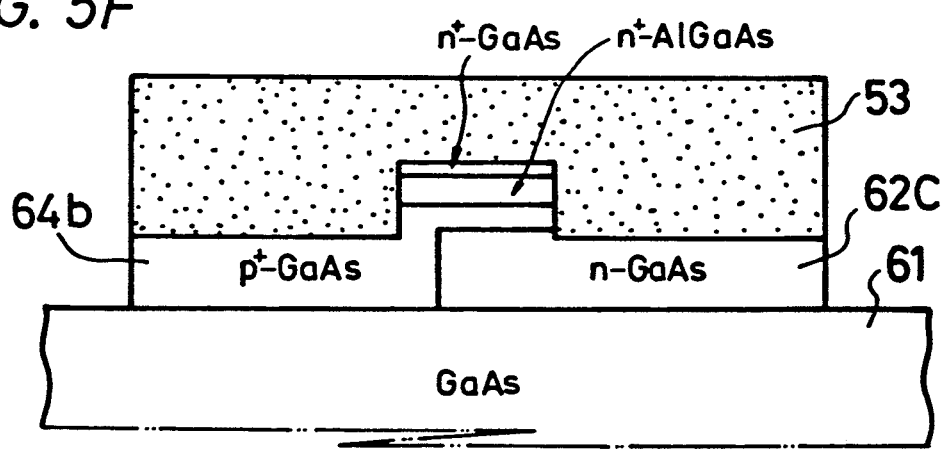

Next, as shown in FIG. 5F, a photoresist layer 55 is used to mask the element regions and the etching is carried out to remove unnecessary portions up to the substrate 61 for isolating the elements, thus forming an external base region 64b.

Figure 5G:
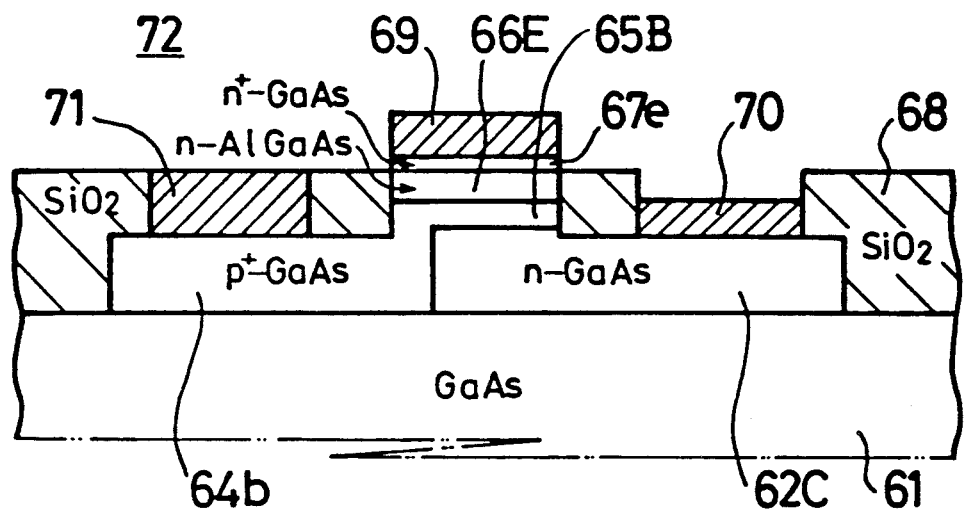

Then, as shown in FIG. 5G, a silicon oxide (SiO$_2$) layer 68 is formed on the upper surface and made flat. Thereafter, windows are formed through the silicon oxide layer 68 to derive the base electrode and the collector electrode. An emitter electrode 69 and a collector electrode 70, each of which is made of AuGe/Au, are respectively formed through the windows on the emitter capping layer 67e and the collector region 62C, which are then annealed at 450° C. for 10 seconds. Thereafter, a base electrode 71 made of Ti/Pt/Au is formed on the external base region 64b, thus forming a desired emitter top type heterojunction bipoplar transistor 72.

Figure 5H:
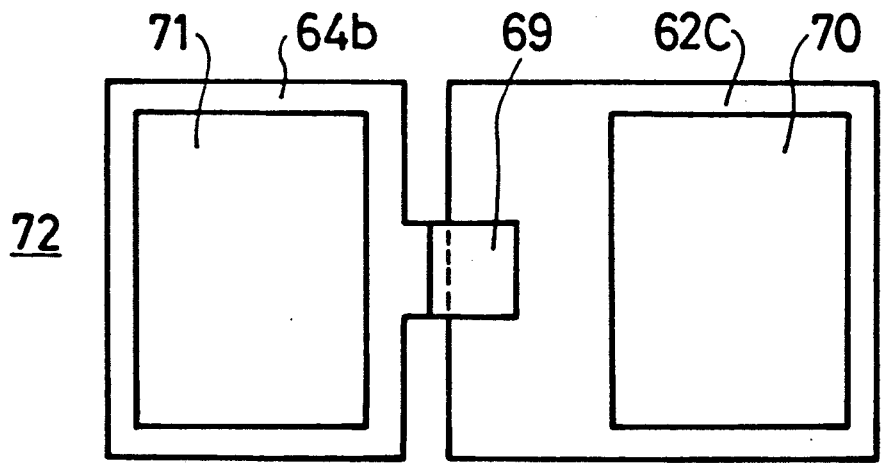
FIG. 5H is a plan view of FIG. 5G.

FIG. 5H is a plan view of this heterojunction bipolar transistor 72. In this case, if an n+-GaAs layer is buried beneath the n-GaAs collector region 62C, the resistance value between the intrinsic collector region and the external collector region is reduced and hence effect is attained. This n-GaAs layer may be formed by the ion implantation technique of Si before the first epitaxial growth.

In the emitter top type heterojunction bipolar transistor 72, the external base region 64b and the collector region 62C contact with each other only at one edge similarly as described above. Further, since the external base region 64b and the emitter region 66E are not substantially in contact with each other, the collector capacitance and the emitter capacitance can be reduced. Furthermore, the external base resistance can be decreased and without increasing the collector capacitance, the base-contact resistance can be reduced. Further, since the intrinsic base region is made by the final epitaxial growth, the thickness of the intrinsic base region can be reduced to its limit and no positional displacement is produced in the junction. Since the element isolation is performed by the etching process shown in FIG. 5F, the conventional ion implantation technique and the annealing technique become unnecessary. The load resistor can easily be realized by the n-GaAs layer 62 forming the collector region 62C and the p+-GaAs layer 64 forming the external base region 64b.

FIG. 6 illustrates a further embodiment of the collector top type heterojunction bipolar transistor according to the present invention. In this embodiment, next to the above process of FIG. 3D, as shown in FIGS. 6A and 6B, the n+-GaAs layer 40, the n-GaAs layer 39 and the p+-GaAs layers 38 and 36 are selectively etched away by the RIE process to form a region 57 which corresponds to the collector region and the external base region. At that time, the region 57 is overlapped on the under emitter region 33E only at one corner portion as shown in FIG. 6B. Then, as shown in FIGS. 6C and 6D, the mask (not shown) is used so as to cover the overlapped portion, whereby through the RIE process, the n+-GaAs layer 40, the n-GaAs layer 39 and the p+-GaAs layer 38 are selectively etched away to form the collector capping layer 40C, the collector region 39C and the intrinsic base region 38B and to face to the external base region 36b outside.

Figure 6E:
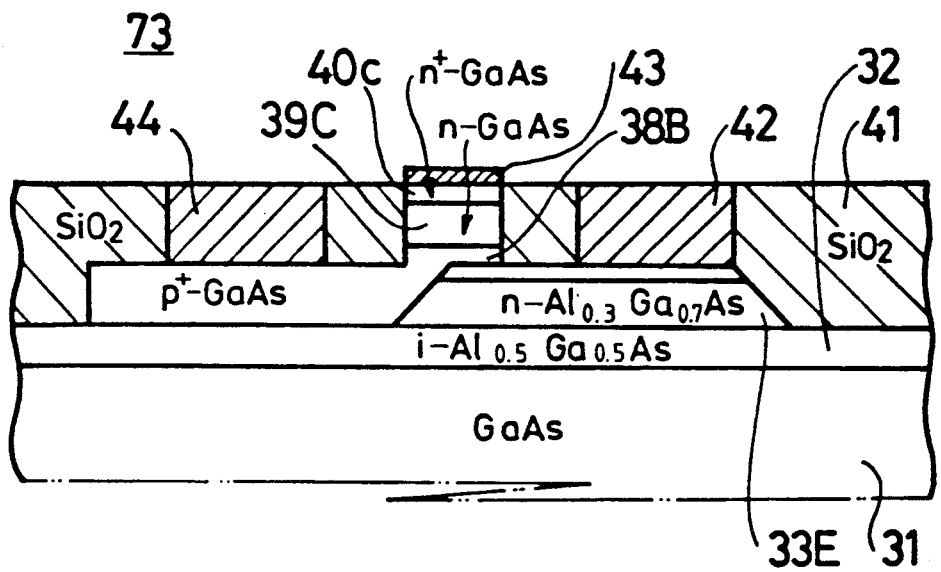
Figure 6F:
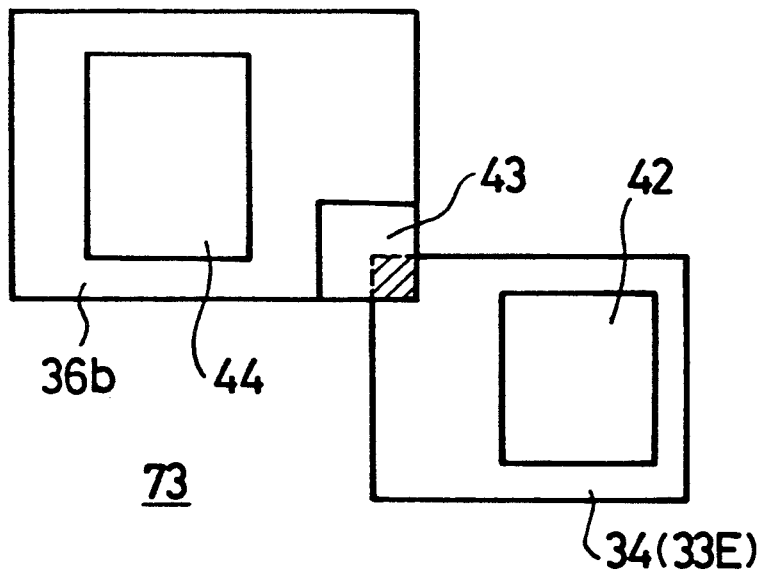

In this case, for example, it is possible that the external base region 36b has the longitudinal length a=3 μm and the lateral length b=5 μm; the emitter region 33E has the longitudinal length c=3 μm and the lateral length d=3 m; and the collector region 39c has the longitudinal and lateral lengths e=1.5 μm. Accordingly, the length of the intrinsic region (hatched portion in FIG. 6D) is in the order of sub-micron. Thereafter, as shown in FIGS. 6E and 6F, the silicon oxide layer 41 is formed on the whole surface and made flat to face the collector capping layer 40c outside. Windows are then formed through the silicon oxide layer 41 and then the emitter electrode 42 and the collector electrode 43, each of which is made of AuGe/Au, are respectively formed on the inclined composition layer 34 and the capping layer 40c. Further, the base electrode 44 made of Ti/Pt/Au is formed on the external base region 36b, thus a desired collector top type heterojunction bipolar transistor 73 being obtained. According to this collector top type heterojunction bipolar transistor 73, the widths of particularly the intrinsic collector region and the intrinsic emitter region can be made smaller than the minimum line width.

While in FIG. 6 the present invention is applied to the collector top type heterojunction bipolar transistor, though not shown, the present invention can similarly be applied to the emitter top type heterojunction bipolar transistor by utilizing the techniques shown in FIG. 5.

While in the above mentioned embodiments the present invention is applied to the heterojunction bipolar transistor of AlGaAs/GaAs system, the present invention can also be applied to other heterojunction bipolar transistor of, for example, GaAs/InGaAs system. With the GaAs (emitter)/InGaAs (base)/GaAs(collector) structure, the present invention can be applied to both of the collector top and emitter top heterojunction bipolar transistors.

Figure 7:
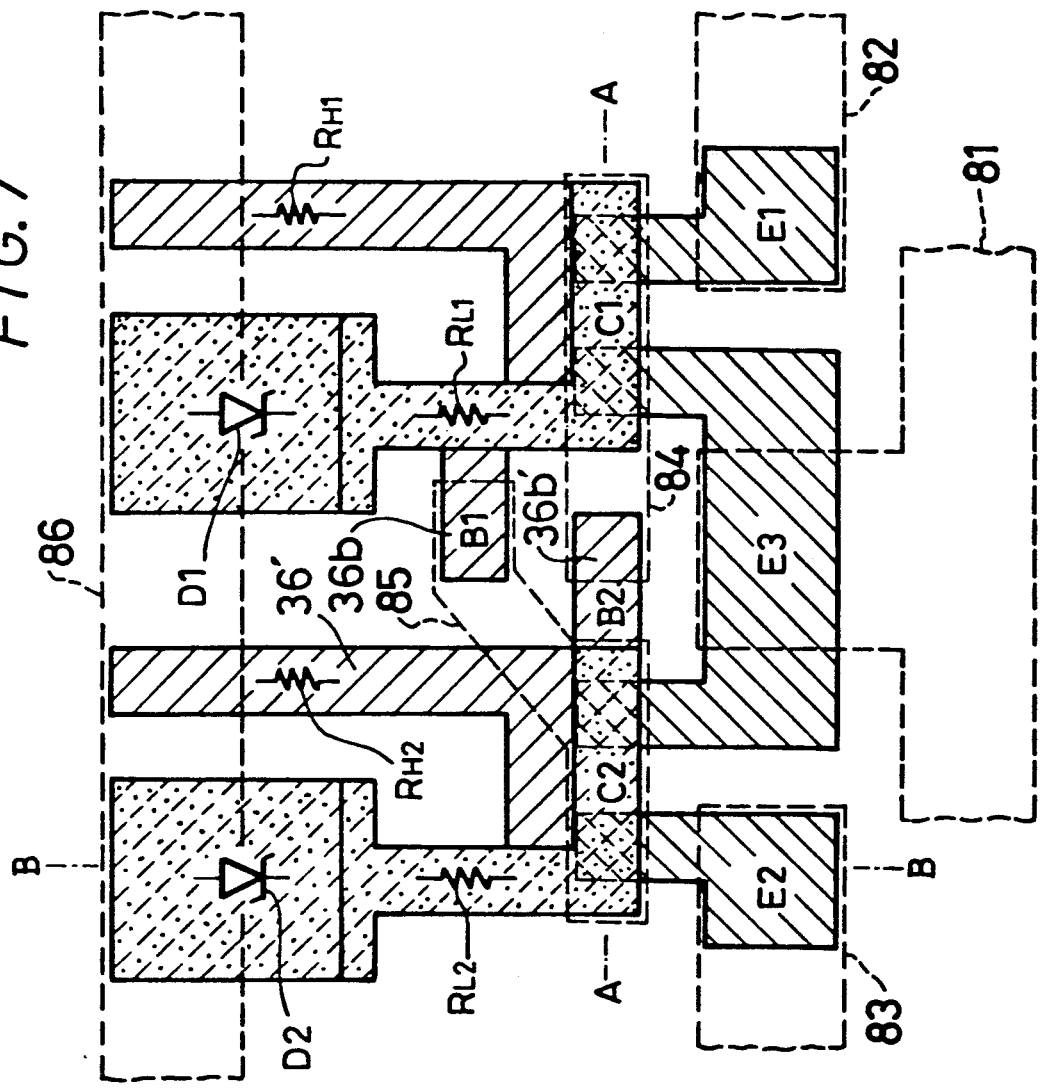
FIG. 7 is a plan view illustrating an example of a memory cell which utilizes the heterojunction bipolar transistor of the present invention.
Figure 9:
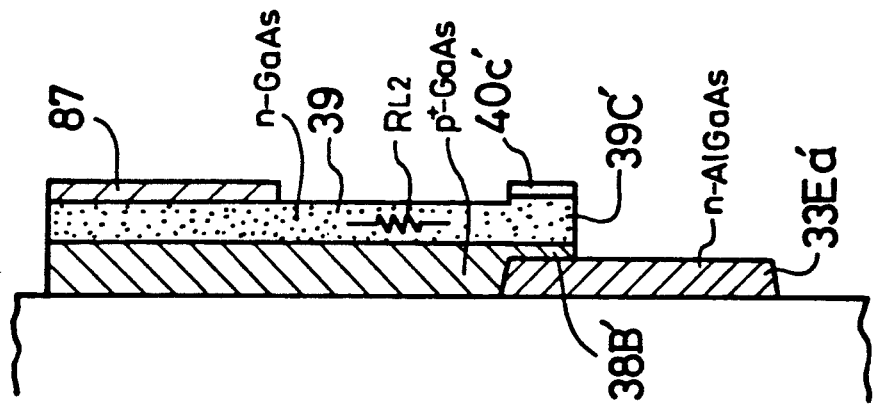
FIG. 9 is a cross-sectional view taken through line B—B in FIG. 7.
Figure 8:
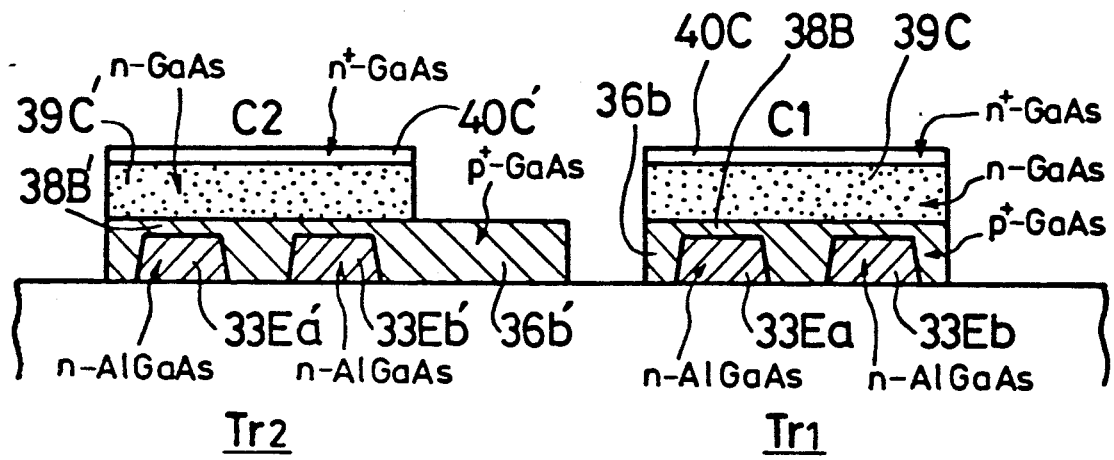
FIG. 8 is a cross-sectional view taken through line A—A in FIG. 7.
Figure 10:
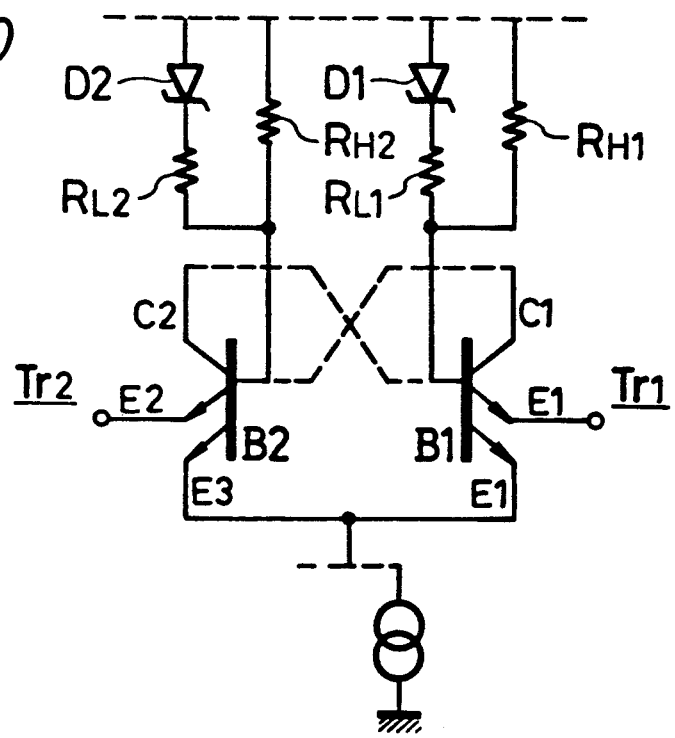
FIG. 10 is a diagram showing an equivalent circuit of FIG. 7.

FIG. 7 is a plan view illustrating an example of a memory cell using the collector top heterojunction bipolar transistor according to the present invention. FIG. 8 is a cross-sectional view taken through the line A—A in FIG. 7 and FIG. 9 is a cross-sectional view taken through the line B—B in FIG. 7. Further, FIG. 10 is a diagram showing an equivalent circuit of this memory cell. Throughout the figures, Tr1 and Tr2 designate first and second heterojunction bipolar transistors, respectively.

As illustrated in FIGS. 7 and 8, the first transistor Tr1 comprises first and second emitter regions 33Ea and 33Eb (that is, E1 and E3) each being formed of the n-AlGaAs layer, an intrinsic base region 38B (that is, B1) formed of the p$^+$-GaAs layer and a collector region 39C (that is, C1) formed of the n-GaAs layer. In like manner, the second transistor Tr2 comprises first and second emitter regions 33Ea' and 33Eb' (i.e., E2 and E3) each of which is formed of the n-AlGaAs layer, an intrinsic base region 38B' (i.e., B2) formed of the p$^+$-GaAs layer and a collector region 39C' (i.e., C2) formed of the n-GaAs layer. Reference numerals 40c and 40c' depict collector capping layers formed of the n$^+$-GaAs layer and 36b and 36b' external base regions formed of the p$^+$-GaAs layer. The second emitters E3 and E3 of both the transistors Tr1 and Tr2 are commonly connected through the n-AlGaAs layer which forms the emitter region. To the portion in which the second emitters E3, E3 are connected is connected a word line (shown in phantom in FIG. 7) 81 that is fabricated by the wiring of the electrodes. To the first emitter E1 of the first transistor Tr1 and the second emitter E2 of the second transistor Tr2, there are connected bit lines (shown in phantom) 82 and 83, each of which is formed by wiring the electrodes. The collector C1 of the first transistor Tr1 and the base B2 of the second transistor Tr2 are commonly connected by means of an electrode wiring 84 (shown in phantom). The base B1 of the first transistor Tr1 and the collector C2 of the second transistor Tr2 are connected to each other through an electrode wiring 85 (shown in phantom). Meanwhile, the base B1 of the first transistor Tr1 is connected with a Schottky diode D1 by way of a low resistance element $R_{L1}$. At the same time, a high resistance element $R_{H1}$ is connected in parallel to the low resistance element $R_{L1}$ and the Schottky diode D1. Similarly, the base B2 of the second transistor Tr2 is connected with a Schottky diode D2 through a low resistance element $R_{L2}$, and a high resistance element $R_{H2}$ is connected in parallel to the low resistance element $R_{L2}$ and Schottky diode D2. The other ends of the Schottky diodes D1 and D2 and the high resistance elements $R_{H1}$ and $R_{H2}$ are respectively connected to a word line (shown in phantom) 86 formed of the electrode wiring. In this case, as shown in FIG. 9, the Schottky diode D2 is formed by depositing a Schottky metal 87 made of Au or Al on one end portion of an n-GaAs layer 39' extended from the collector region 39C' except the n$^+$-GaAs capping layer 40c'. The low resistance element $R_{L2}$ is formed by the n-GaAs layer 39' formed between the collector region 39C' and the n-GaAs layer forming the Schottky diode D2. That is, the low resistance element $R_{L2}$ in the collector region 39C' and the Schottky diode D2 are formed integrally as a unitary structure by the common n-GaAs layer 39'. Meanwhile, the high resistance element $R_{H2}$ is integrally formed with the p$^+$-GaAs layer 36' extended from the external base region 36b'. The Schottky diode D1, the low resistance element $R_{L1}$ and the high resistance element $R_{H1}$ connected to the first transistor Tr1 are the same in arrangement as those of the Schottky diode D2, the low resistance element $R_{L2}$ and the high resistance element $R_{H2}$ and therefore need not be described.

If the memory cell is formed in the rule of minimum line/space 1 μm, the dimension of one cell becomes about 11×13 μm$^2$. This dimension is very small, which is the same or smaller than that of the composite Si bipolar memory in the same circuit. According to the standard emitter top heterojunction bipolar transistor structure, it is generally difficult to form the resistance element by utilizing the epitaxial layer. The reason for this will be considered as follows. If the n-GaAs layer of the lower layer is employed as the resistance element, the n$^+$-GaAs sub-collector layer is formed therebeneath so that a resistance element of more than several 100s of ohms needs too large dimension. Alternatively, if the p$^+$-GaAs layer formed by the ion implantation is employed as the resistance element, the n-GaAs layer is formed therebeneath so that a parasitic capacitance component may exert a bad influence. On the contrary, the heterojunction bipolar transistor structure of the present invention can overcome these difficulties.

According to the above embodiments of the present invention, as set forth above, since the external capacitance can be made small, the collector capacitance and the emitter capacitance can be reduced. Further, since the external base region is formed to have high concentration by the epitaxial growth, the external base resistance can be reduced and also the base-contact dimension can be increased without increasing the capacitance, and hence the base-contact resistance can be lowered. Thus, it is possible to obtain the heterojunction bipolar transistor which can operate at high speed satisfactorily.

Further, according to the above embodiments of the present invention, since the collector, base and emitter regions are each arranged to face the surface, the trench for attaching the electrode used in the prior art becomes unnecessary. Furthermore, the ion implantation technique becomes also unnecessary so that the reproducibility of the element can be enhanced. In addition, since the intrinsic base region is formed by the final epitaxial growth, the thickness of the base region can be decreased to its limit and the junction can be carried out without positional displacement. Thus, this kind of the heterojunction bipolar transistor can be formed as a highly integrated circuit (IC) and fabricated as an integrated circuit with ease.

According to the above embodiments of the present invention, as described above, since the intrinsic base region and the external base region are brought in contact with each other at one edge and also the width of the intrinsic base region is made smaller than that of the external base region, even when the device is miniaturized, the base-contact resistance can be decreased. As a result, the external capacitance at the periphery can be decreased and the collector capacitance and the emitter capacitance can be reduced.

Furthermore, according to the present invention, as set forth above, the external capacitance at the periphery can be decreased and also the collector capacitance and the emitter capacitance can be decreased. At the same time, the dimension of the external base can be increased without increasing the capacitance and further, the base-contact resistance can be lowered.

In addition, since the barrier layer is interposed between the external base region and the emitter region, which contact with one another and the compound semiconductor substrate, the leakage current between the emitter region and the external base region through the substrate can be avoided.

According to the present invention, the intrinsic region can be made smaller than the minimum line width achieved by the photolithography technique and the element can be made smaller.

Figure 11:
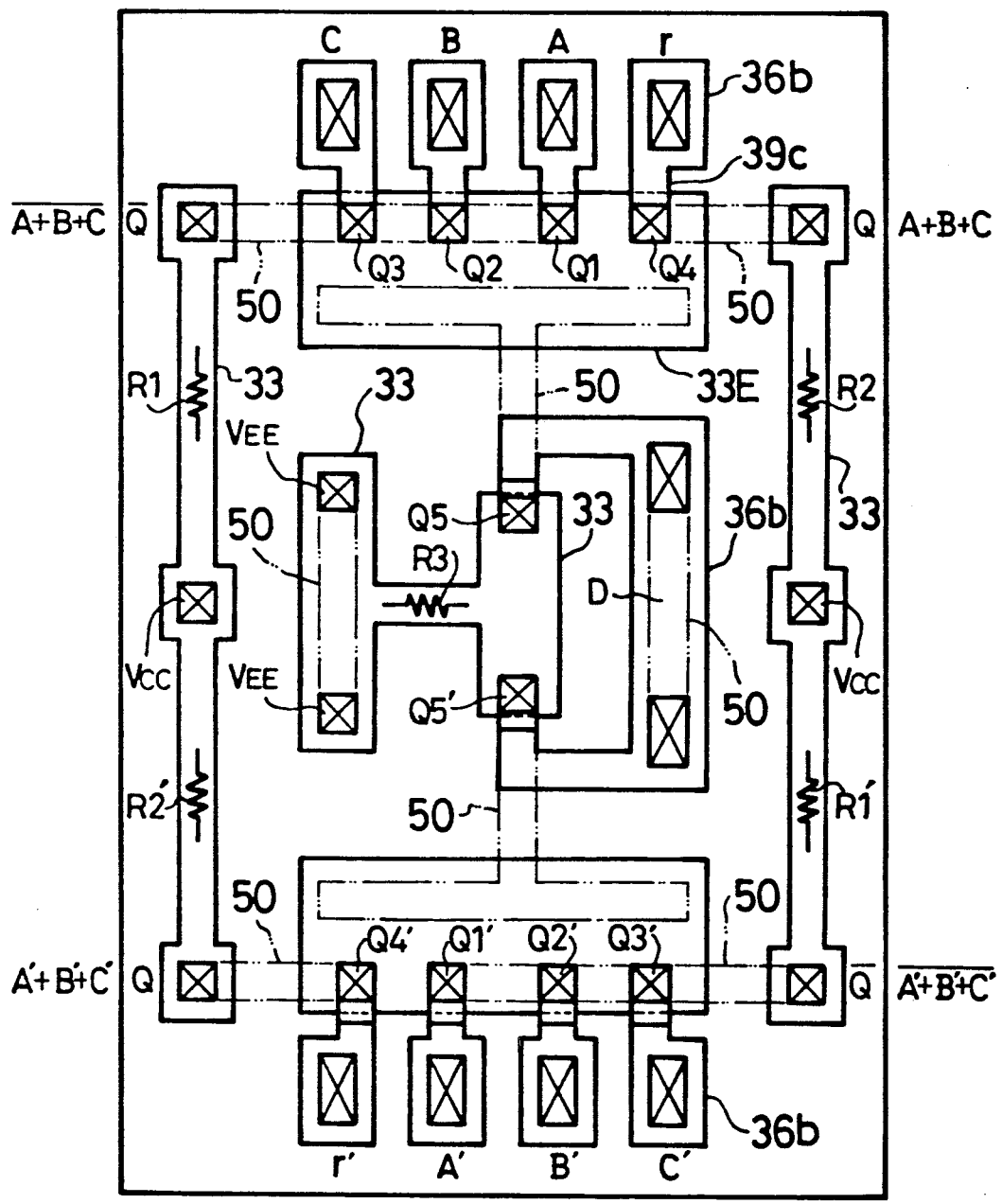
FIG. 11 is a plan view illustrating an example of a semiconductor integrated circuit, that is, two gates of 3-input NOR and OR circuits which utilize the collector top type heterojunction bipolar transistor of the present invention.
Figure 12:
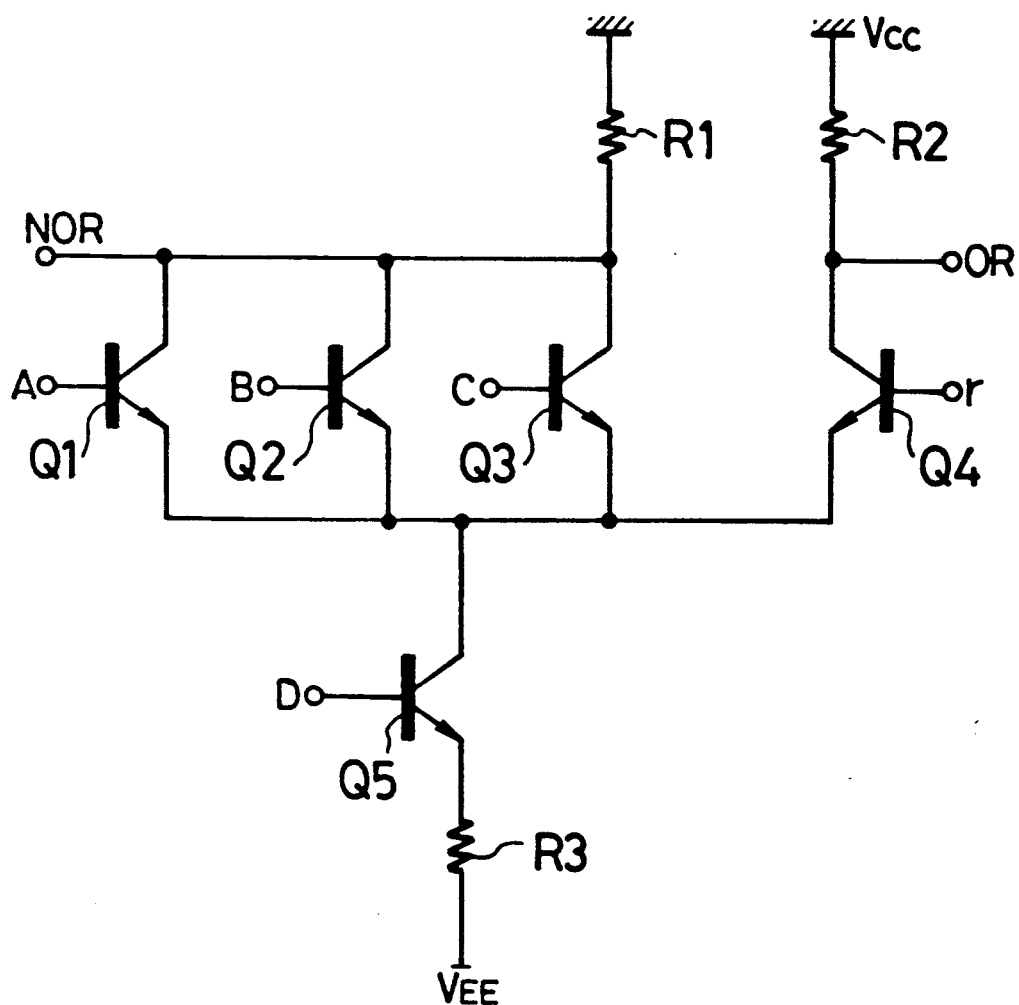
FIG. 12 is a diagram illustrating an equivalent circuit of an upper half portion of FIG. 11.

FIG. 11 is a plan view of 2 gates, that is, 3-input NOR and OR circuits which employ the collector top type heterojunction bipolar transistor of the present invention shown in FIG. 3. FIG. 12 illustrates an equivalent circuit of only the upper half portion of the semiconductor integrated circuit shown in FIG. 11. Since the lower half portion thereof is perfectly the same as the upper half portion, the parts of the lower half portion of the integrated circuit corresponding to those of the upper half portion are designated by the same reference numerals each with or prime in FIG. 11 and therefore need not be described in detail.

In this embodiment, a load resistor R1 commonly connected to the collectors of transistors Q1, Q2 and Q3, a load resistor R2 connected to the collector of a transistor Q4 and a load resistor R3 connected to the emitter of a transistor Q5 are each formed by the n-AlGaAs layer 33 which constructs the emitter region 33E shown in FIG. 11. Also, load resistors R1' and R2' at the side of the transistors Q1', Q2', Q3' and Q4' are each formed of the AlGaAs layer 33, in a similar fashion. A phantom 50 designates a metal wiring. The respective load resistors R1, R2, R3, R1' and R2' may be formed of the p+-GaAs layer 36 which forms, for example, the external base region 36b.

According to the semiconductor integrated circuit shown in FIG. 11, the load resistor can be realized by the n-AlGaAs layer 33 or the p+-GaAs layer 36 with ease. Particularly, as compared with the conventional emitter top type heterojunction bipolar transistor, the lead wires are not laid around so that it can be simplified in structure. In FIGS. 11 and 12, references A, A', B, B', C, C', D, r and r' designate inputs respectively. While, references A+B+C, A'+B'+C', $\overline{A+B+C}$ and $\overline{A'+B'+C'}$ respectively designate outputs.

According to the semiconductor integrated circuit of the present invention shown in FIGS. 11 and 12, since the load resistors are formed by the same material layer which forms the emitter region or the base region of the transistor, the semiconductor integrated circuit of the present invention can be simplified in structure.

Therefore, the semiconductor integrated circuit of the present invention shown in FIGS. 11 and 12 is suitable for the high speed bipolar circuit apparatus such as CML and the like.

Figure 13:
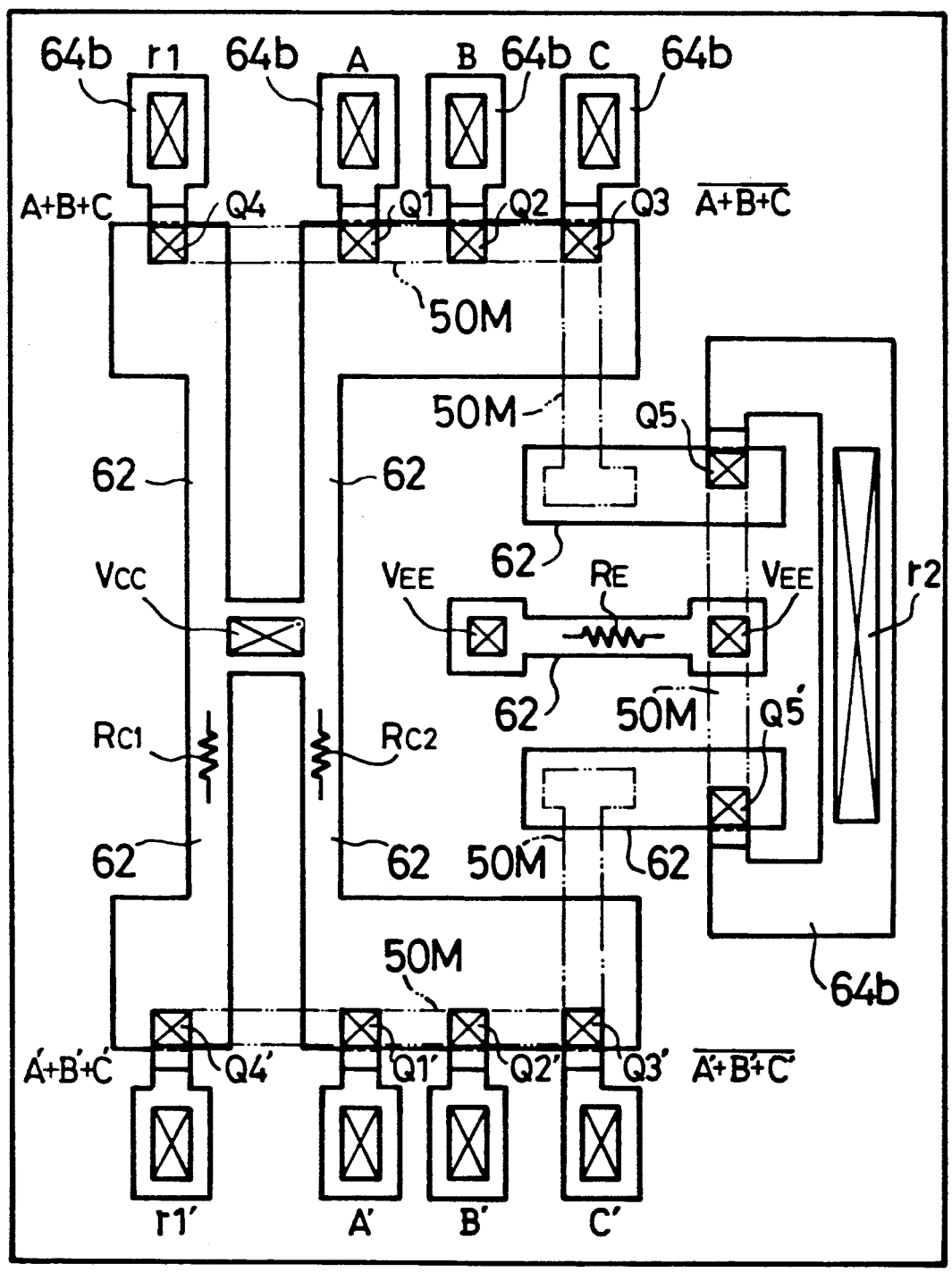
FIG. 13 is a plan view illustrating an example of a semiconductor integrated circuit, that is, two gates of 3-input NOR and OR circuits which utilize the emitter top type heterojunction bipolar transistor of the present invention.
Figure 14:
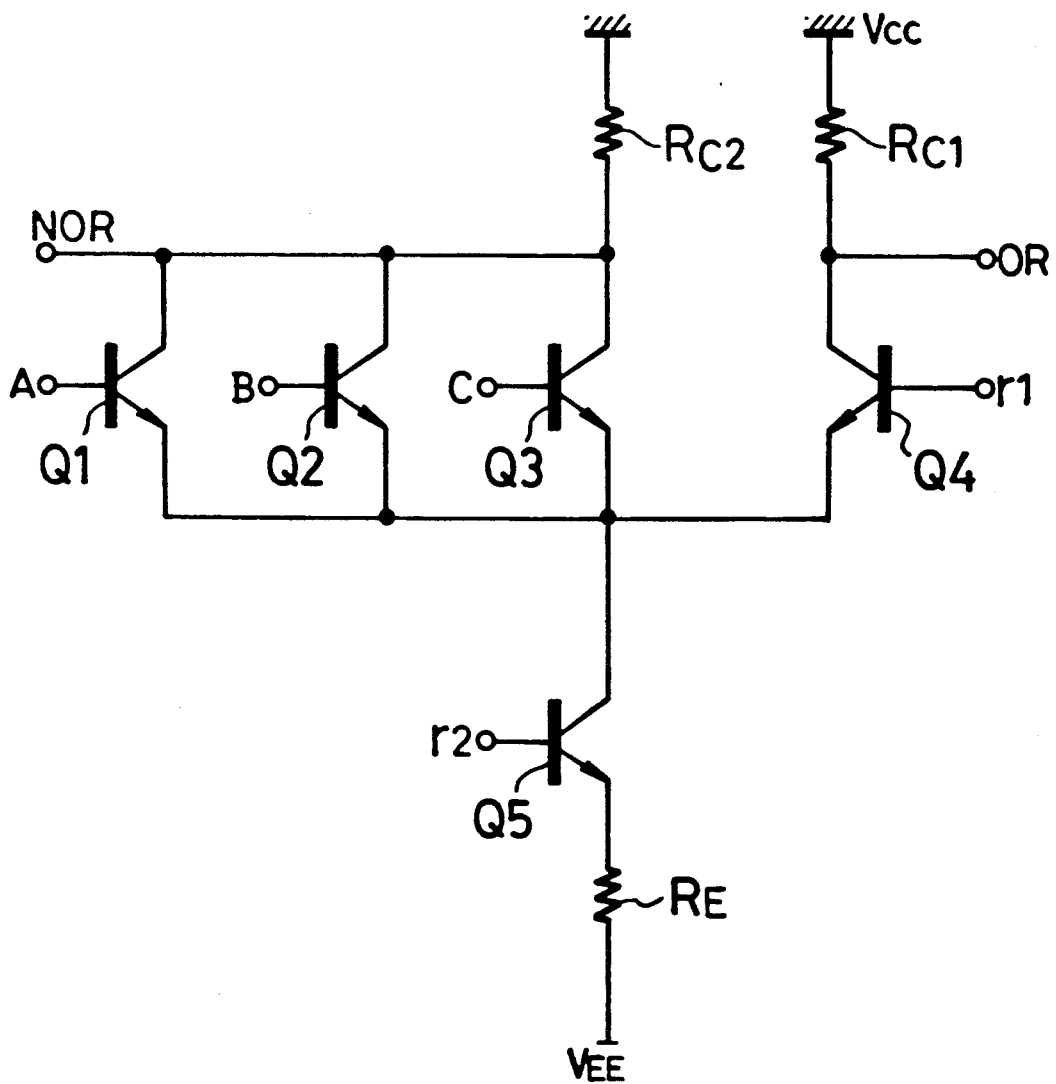
FIG. 14 is a diagram showing an equivalent circuit of an upper half portion of FIG. 13.

FIG. 13 is a plan view of 2 gates, that is, 3-input NOR and OR circuits which employ the emitter top type heterojunction bipolar transistor 72 shown in FIG. 5 of the present invention. FIG. 14 illustrates an equivalent circuit of only the upper half portion of the semiconductor integrated circuit shown in FIG. 13. Since the lower half portion thereof is the same as the upper half portion, the parts of the lower half portion corresponding to the parts of the upper half portion are marked with like reference numerals with primes in FIG. 13.

In this embodiment, a load resistor $R_{C2}$ commonly connected to the collectors of the transistors Q1, Q2 and Q3, a load resistor $R_{C1}$ connected to the collector of the transistor Q4 and a load resistor $R_E$ connected to the emitter of the transistor Q5 are each formed of the n-GaAs layer 62 which constructs the collector region 62C. A phantom 50 designates a metal wiring. In this case, the respective load resistors $R_{C1}$, $R_{C2}$ and $R_E$ may be formed of the p+-GaAs layer 64 which forms, for example, the external base region 64b.

In the semiconductor integrated circuit shown in FIG. 13, the load resistor can be realized by the n-GaAs layer 62 or the p+-GaAs layer 64 so that the semiconductor integrated circuit of the invention can be simplified in structure. In FIG. 13, references A, B, C, r2, r1 and r1' designate inputs, respectively. Also, references A+B+C, A'+B'+C', $\overline{A+B+C+}$ and $\overline{A'+B'+C'}$ designate outputs, respectively.

According to the semiconductor integrated circuit of the present invention shown in FIGS. 13 and 14, the load resistor can be formed of the material layer same as that of the collector region or the base region of the transistor so that the semiconductor integrated circuit of the invention can be simplified in structure. Therefore, the semiconductor integrated circuit of the present invention shown in FIGS. 13 and 14 is particularly suitable for the high speed bipolar circuit apparatus such as the CML or the like.

It should be understood that the above description is presented by way of example on the preferred embodiments of the present invention and it will be apparent that various modifications and variations could be effected by one with ordinary skill in the art without departing from the spirit and scope of the novel concepts of the invention so that the scope of the invention should be determined only by the appended claims.

I claim as my invention:

1. A heterojunction bipolar transistor comprising:
   a) an emitter region;
   b) a base region; and
   c) a collector region, wherein an intrinsic base region and an external base region of said base region contact with each other at one side edge of each with said intrinsic base in the form of a rectangle extending laterally from said external base in a plane parallel to said substrate, and the length and width of said extending rectangle is selected to be smaller than that of said external base region.

2. A semiconductor integrated circuit comprising:
   A) a collector top type heterojunction bipolar transistor having
      a) an emitter region layer;
      b) an external base region layer having a surface generally coplanar with a surface of said emitter region layer, and contacting said coplanar emitter region at one side edge surface of each of said layers, each said side surface being transverse to said coplanar surfaces;
      c) an intrinsic base region connected to said external base region and extending laterally therefrom into a region overlapping the boundary between said emitter region and said external base region;

d) a collector region formed on said intrinsic base region; and

B) a load resistor made of a material layer the same as that forming said emitter or base region of said collector top type heterojunction bipolar transistor.

3. A semiconductor integrated circuit comprising:

A) an emitter top type heterojunction bipolar transistor having
   a) a collector region layer;
   b) an external base region layer generally coplanar with said collector region layer, and contacting a side surface of said collector region at a single side surface through the thickness of said external base region layer;
   c) an intrinsic base region connected to said external base region and extending laterally therefrom into a region overlapping the boundary between said collector region and said external base region; and
   d) an emitter region formed on said intrinsic base region; and B) a load resistor made of a material the same as that of said collector or base region of said emitter top type heterojunction bipolar transistor.

4. A heterojunction bipolar transistor comprising:
a) a compound semiconductor substrate;
b) an emitter region;
c) a base region including an intrinsic base region and an external base region, said external base region and said emitter region being formed on said substrate in a single layer supported by a common surface of said substrate in side-by-side fashion with only the edges of said external base region and said emitter region adjacent each other within said single layer;
said intrinsic base region overlying said emitter region;
d) a collector region; and
e) a barrier layer formed between said external base and emitter regions and said compound semiconductor substrate.

5. A heterojunction bipolar transistor comprising:
a) an emitter region;
b) a collector region;
c) a base region, said external base region and and an intrinsic base region, said external base region and said emitter region being formed on said substrate in a single layer supported by a common surface of said substrate in side-by-side fashion, with said intrinsic base formed as an overlapping area extending laterally from said external base region approximately parallel to said substrate and overlapping an area of said emitter region and overlapping an area of said collector region, with said external base region not overlapping either said collector or emitter regions, said overlapping area having a length and width measured in a plane parallel to said substrate which is less than the length and width of said external base region measured in a plane parallel to said substrate, said base region being partly overlapped on said emitter or collector region, wherein said collector or emitter region is formed on a region including said overlapped portion of said base region; and
said intrinsic base region formed by said overlapped portion.

6. A heterojunction bipolar transistor comprising:
a) a semiconductor substrate;
b) an external base region;
c) an emitter region;
d) a collector region, one of said emitter or collector regions being formed on said substrate in a single layer with said external base region supported by a common surface of said substrate, with said one region and said external base region in side-by-side relationship on said common surface, with said external base region contacting said one of said emitter or collector region at only one part of said external base region adjacent a side surface thereof, said side surface being transverse to said common surface; and
e) an intrinsic base region having a length and width less than said external base region and connected to and extending laterally from said external base region to overlap the boundary between said emitter and collector regions, and said external base region not contacting with the other parts of said emitter or collector, wherein the other of sad collector or emitter region is formed on said intrinsic base region.

* * * * *